US009178116B2

(12) United States Patent
Hodota

(10) Patent No.: US 9,178,116 B2
(45) Date of Patent: Nov. 3, 2015

(54) SEMICONDUCTOR LIGHT-EMITTING ELEMENT

(75) Inventor: Takashi Hodota, Ichihara (JP)

(73) Assignee: TOYODA GOSEI CO. LTD., Aichi (JP)

( * ) Notice: Subject to any disclaimer, the term of this patent is extended or adjusted under 35 U.S.C. 154(b) by 212 days.

(21) Appl. No.: 13/643,623

(22) PCT Filed: Jun. 24, 2011

(86) PCT No.: PCT/JP2011/064507
§ 371 (c)(1),
(2), (4) Date: Oct. 26, 2012

(87) PCT Pub. No.: WO2011/162367
PCT Pub. Date: Dec. 29, 2011

(65) Prior Publication Data
US 2013/0069095 A1    Mar. 21, 2013

(30) Foreign Application Priority Data
Jun. 25, 2010    (JP) .................................. 2010-145170

(51) Int. Cl.
*H01L 33/60*    (2010.01)
*H01L 33/42*    (2010.01)
(Continued)

(52) U.S. Cl.
CPC .................. *H01L 33/42* (2013.01); *H01L 33/32* (2013.01); *H01L 33/405* (2013.01); *H01L 33/46* (2013.01)

(58) Field of Classification Search
CPC ....... H01L 33/405; H01L 33/32; H01L 33/42; H01L 33/46
See application file for complete search history.

(56) References Cited

U.S. PATENT DOCUMENTS

| 2001/0023779 A1 | 9/2001 | Sugaya et al. |
| 2006/0180818 A1 | 8/2006 | Nagai et al. |

(Continued)

FOREIGN PATENT DOCUMENTS

| JP | 2005-197289 A | 7/2005 |
| JP | 2006-303430 A | 11/2006 |

(Continued)

OTHER PUBLICATIONS

International Search Report for Entry of PCT/JP2011/064507 dated Sep. 13, 2011.

*Primary Examiner* — Caleb Henry
*Assistant Examiner* — Mounir Amer
(74) *Attorney, Agent, or Firm* — Sughrue Mion, PLLC

(57) ABSTRACT

A semiconductor light-emitting element (1) including: an n-type semiconductor layer (140); a light-emitting layer (150); a p-type semiconductor layer (160); a transparent conductive layer (170) laminated on the p-type semiconductor layer; a reflective film (180) which is composed of a material having optical transparency to light emitted from the light-emitting layer and an insulating property and is laminated on the transparent conductive layer; a p-conductive body (200) which penetrates the reflective film and is electrically connected to the transparent conductive layer; an n-electrode (310) electrically connected to the n-type semiconductor layer; and a p-electrode (300) having a p-adhesion layer (301) which is laminated on the reflective film, is electrically connected to the other end of the p-conductive body, and is composed of the same material as that for the transparent conductive layer and a p-metal reflective layer (302) which is laminated on the p-adhesion layer.

20 Claims, 10 Drawing Sheets

(51) Int. Cl.
   *H01L 33/32*   (2010.01)
   *H01L 33/40*   (2010.01)
   *H01L 33/46*   (2010.01)

(56) References Cited

U.S. PATENT DOCUMENTS

| | | |
|---|---|---|
| 2006/0231852 A1 | 10/2006 | Kususe et al. |
| 2006/0231854 A1 | 10/2006 | Chae et al. |
| 2006/0267042 A1 | 11/2006 | Izuno et al. |
| 2008/0029761 A1 | 2/2008 | Peng |
| 2009/0078951 A1 | 3/2009 | Miki et al. |
| 2009/0179215 A1* | 7/2009 | Matsui et al. .................... 257/98 |
| 2009/0297870 A1* | 12/2009 | Takeyama et al. ............. 428/523 |
| 2010/0059768 A1* | 3/2010 | Hasnain .......................... 257/93 |
| 2010/0295086 A1 | 11/2010 | Shinohara et al. |

FOREIGN PATENT DOCUMENTS

| | | |
|---|---|---|
| JP | 2007-13045 A | 1/2007 |
| JP | 2009-164423 A | 7/2009 |
| JP | 2009-260237 A | 11/2009 |

\* cited by examiner

SEMICONDUCTOR LIGHT-EMITTING ELEMENT

CROSS REFERENCE TO RELATED APPLICATIONS

This application is a National Stage of International Application No. PCT/JP2011/064507 filed on Jun. 24, 2011, which claims priority from Japanese Patent Application No. 2010-145170, filed on Jun. 25, 2010, the contents of all of which are incorporated herein by reference in their entirety.

TECHNICAL FIELD

The present invention relates to a semiconductor light-emitting element.

BACKGROUND ART

In general, a semiconductor light-emitting element using a group-III nitride semiconductor such as GaN is configured by forming a group-III nitride semiconductor layer including a light-emitting layer on a substrate such as sapphire. In such a semiconductor light-emitting element, there is a configuration in which a semiconductor light-emitting element is mounted on a wiring board by flip chip attachment thereby to emit light which is to be outputted from the light-emitting layer to the outside via the substrate.

As a related art described in an official gazette, there is a configuration in which a metallic reflective film composed of silver or the like is formed on one side of the group-III nitride semiconductor layer, which is opposite to a contact surface being in contact with the substrate and thereby light outputted from the light-emitting layer to the side opposite to the substrate is configured to be reflected to the substrate side (refer to Patent Literature 1).

CITATION LIST

Patent Literature

Patent Document 1: Japanese Patent Application Laid Open Publication No. 2006-303430

SUMMARY OF INVENTION

Technical Problem

In such a semiconductor light-emitting device, it is required that more light outputted from the semiconductor light-emitting element is extracted to the outside, that is, light extraction efficiency in the semiconductor light-emitting device is improved, and thus various materials are tried to be used for forming each layer of the semiconductor light-emitting element. On the other hand, adhesiveness between layers in the semiconductor light-emitting element is required to be improved.

An object of the present invention is to improve the adhesiveness between the layers in the semiconductor light-emitting element which is mounted by face up or flip chip attachment.

Solution to Problem

In order to attain the above object, there is provided a semiconductor light-emitting element of the present invention including: a first semiconductor layer that is composed of a group-III nitride semiconductor having a first conductivity type; a light-emitting layer that is laminated on one surface of the first semiconductor layer to expose a part of the one surface, and that emits light upon conducting an electric power; a second semiconductor layer that is composed of a group-III nitride semiconductor having a second conductivity type different from the first conductivity type, and that is laminated on the light-emitting layer; a first transparent conductive layer that is composed of a material having transparency to light emitted from the light-emitting layer and a conductive property, and that is laminated on the second semiconductor layer; a transparent insulating layer that is composed of a material having transparency to the light emitted from the light-emitting layer and an insulating property, that has a penetration hole in a thickness direction, and that is laminated on the first transparent conductive layer; a first electrode that is electrically connected to the first semiconductor layer; and a second electrode that is configured with a second transparent conductive layer composed of a material same as the material of the first transparent conductive layer and laminated to cover the transparent insulating layer and the first transparent conductive layer exposed through the penetration hole, and a metal reflective layer composed of a metal material having reflectance to the light emitted from the light-emitting layer and a conductive property and laminated on the second transparent conductive layer.

Further, a thickness of the second transparent conductive layer laminated on the first transparent conductive layer exposed through the penetration hole is thinner than a thickness of the transparent insulating layer.

Furthermore, the first transparent conductive layer and the second transparent conductive layer are composed of a metal oxide.

Still furthermore, the metal oxide is a metal oxide containing indium.

Still furthermore, the metal oxide containing indium is IZO (indium zinc oxide).

Still furthermore, the first transparent conductive layer is composed of crystallized IZO, the second transparent conductive layer is composed of uncrystallized IZO, and the thickness of the second transparent conductive layer laminated on the first transparent conductive layer exposed through the penetration hole is thinner than a thickness of the first transparent conductive layer.

Still furthermore, a sum of the thickness of the second transparent conductive layer laminated on the first transparent conductive layer exposed through the penetration hole and a thickness of the metal reflective layer laminated on the second transparent conductive layer laminated on the first transparent conductive layer is smaller than the thickness of the transparent insulating layer.

Still furthermore, the transparent insulating layer is composed of a material having a refractive index lower than those of the first transparent conductive layer and the second transparent conductive layer.

Still furthermore, the first transparent conductive layer is composed of a material having a first refractive index, the transparent insulating layer is composed of a material having a second refractive index lower than the first refractive index, and a thickness $H$ of the transparent insulating layer has a relation as $(\lambda/4n) \times (B-0.5) \leq H \leq (\lambda/4n) \times (B+0.5)$, where the second refractive index is denoted by $n$, a wavelength of the light emitted from the light-emitting layer is denoted by $\lambda$ and $B$ is set as an odd number not less than 3.

Still furthermore, the metal reflective layer is composed of silver or a silver alloy.

Still furthermore, the transparent insulating layer is composed of silicon dioxide.

Advantageous Effects of Invention

According to the present invention, it is possible to improve adhesiveness between layers in a semiconductor light-emitting element which is mounted by face up attachment, especially by flip chip attachment.

DESCRIPTION OF EMBODIMENTS

Hereinbelow, exemplary embodiments of the present invention will be described in detail with reference to the accompanying drawings.

Figure 1:
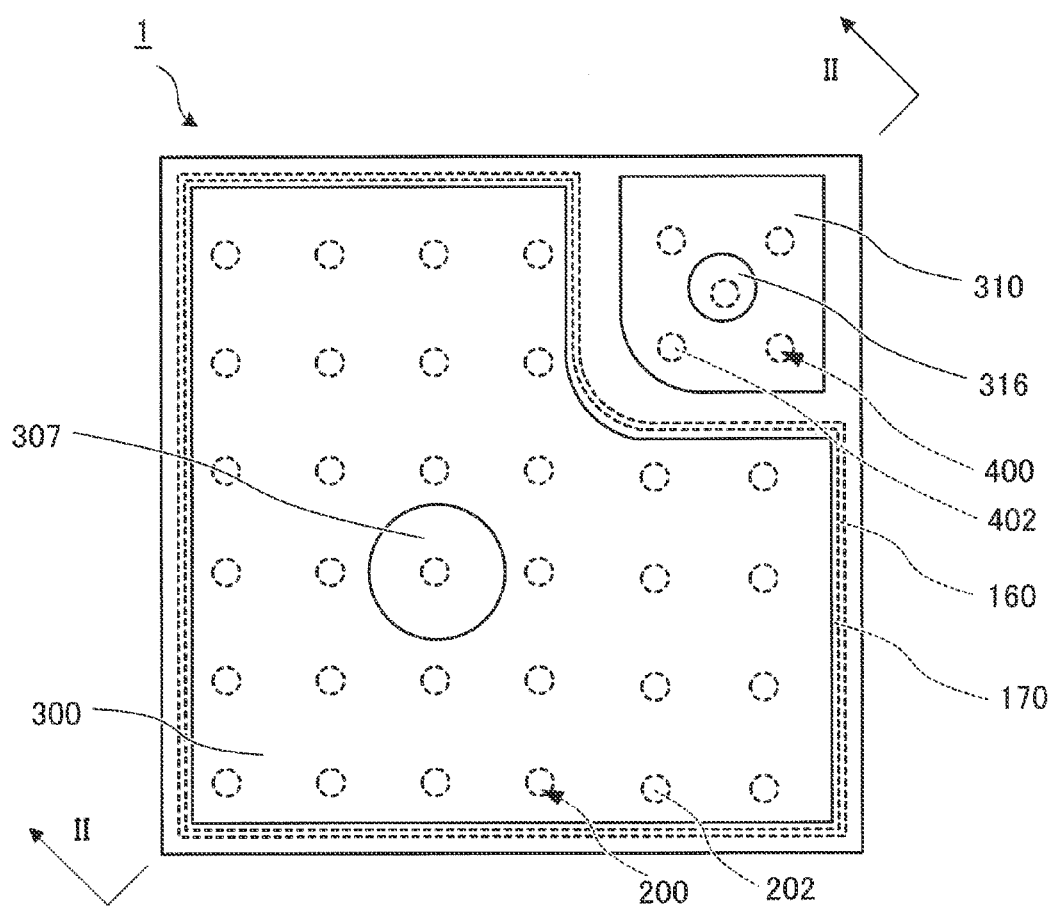
FIG. 1 shows an example of a schematic top view of a semiconductor light-emitting element.
Figure 2:
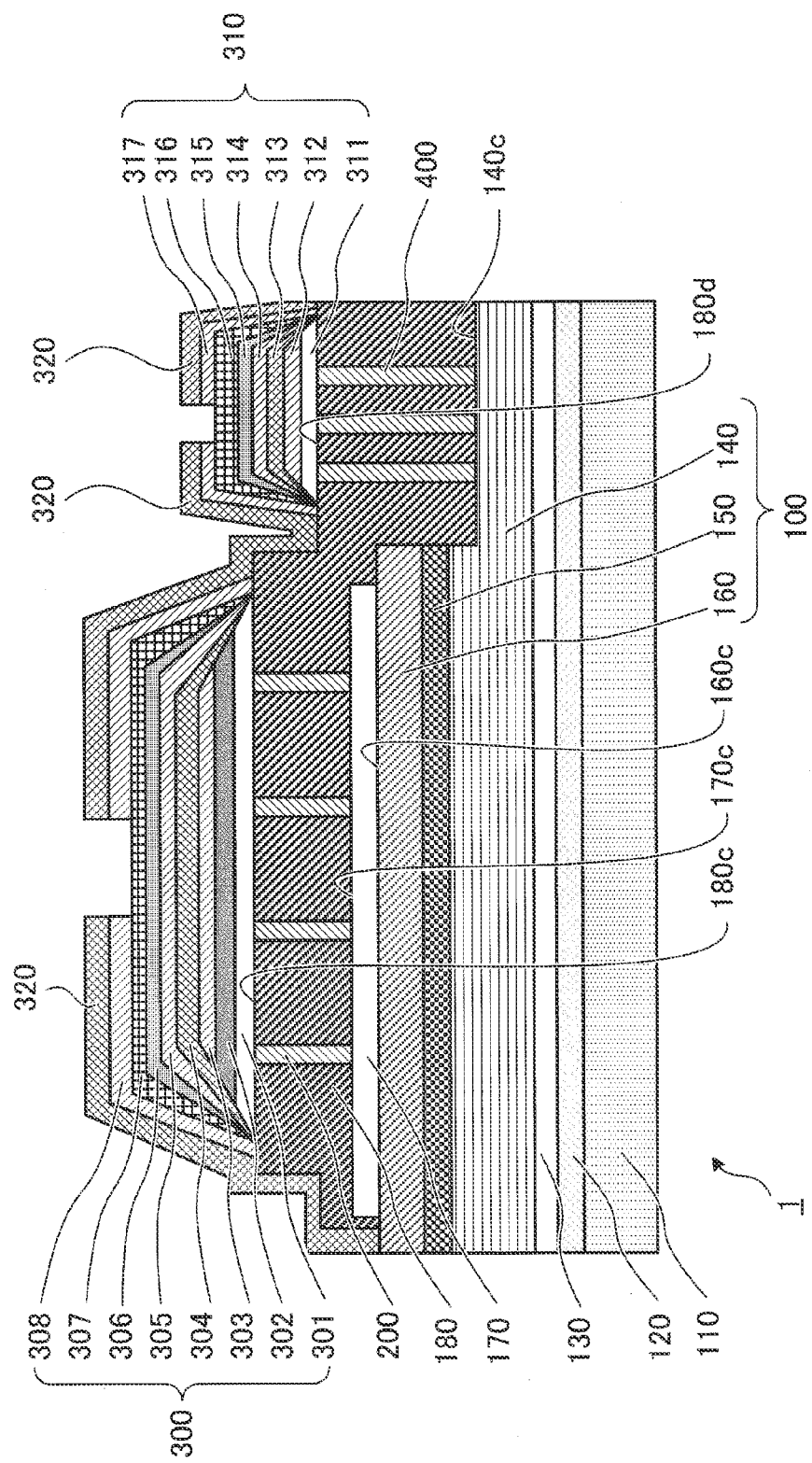
FIG. 2 shows a cross-sectional view taken along a line II-II in FIG. 1.

FIG. 1 shows an example of a schematic top view of a semiconductor light-emitting element (light-emitting diode) 1 to which the exemplary embodiment is applied, and FIG. 2 shows a cross-sectional view of the semiconductor light-emitting element 1 taken along a line II-II in FIG. 1. Note that, in FIG. 1, a top view of the semiconductor light-emitting element 1 in which a passivation layer 320 to be described later is eliminated is shown, as a matter of convenience.

The semiconductor light-emitting element 1 shown in FIG. 1 and FIG. 2 is provided with: a substrate 110; an intermediate layer 120 laminated on the substrate 110; and a base layer 130 laminated on the intermediate layer 120. Further, the semiconductor light-emitting element 1 is provided with: an n-type semiconductor layer 140 as an example of a first semiconductor layer laminated on the base layer 130; a light-emitting layer 150 laminated on the n-type semiconductor layer 140; and a p-type semiconductor layer 160 as an example of a second semiconductor layer laminated on the light-emitting layer 150. Note that, in the following description, the n-type semiconductor layer 140, the light-emitting layer 150 and the p-type semiconductor layer 160 may be collectively referred to as a laminated semiconductor layer 100 as necessary.

In the semiconductor light-emitting element 1, a top surface 140c of the n-type semiconductor layer 140, which has been exposed by cutting out a part of the laminated p-type semiconductor layer 160, light-emitting layer 150 and n-type semiconductor layer 140, is formed.

Further, on the p-type semiconductor layer 160, a transparent conductive layer 170 having a conductive property and transparency to light outputted from the light-emitting layer 150 is laminated.

The semiconductor light-emitting element 1 is further provided with a thin-film for protecting the laminated semiconductor layer 100 and the transparent conductive layer 170. The thin-film has a function that reflects light outputted from the light-emitting layer 150 (which will be described in detail later) in addition to a function that protects the laminated semiconductor layer 100 and the like, in the exemplary embodiment. The thin-film is called a reflective film 180. The reflective film 180 is composed of a material having an insulating property and transparency to light outputted from the light-emitting layer 150. Further, the reflective film 180 is composed of a material having a refractive index lower than that of the transparent conductive layer 170.

The reflective film 180 is formed to be laminated on the transparent conductive layer 170, the p-type semiconductor layer 160 on which the transparent conductive layer 170 is not laminated, and the n-type semiconductor layer 140 on which the light-emitting layer 150 is not laminated. Also, the reflective film 180 covers a side surfaces of the light-emitting layer 150 and the p-type semiconductor layer 160, that is, a section as a wall portion of a step formed by the p-type semiconductor layer 160 and the n-type semiconductor layer 140, and further covers a side surface of the transparent conductive layer 170.

The reflective film 180 has plural penetration holes formed therein. Some of the plural penetration holes provided in the reflective film 180 are formed above the transparent conductive layer 170 in a direction vertical to the surface of the transparent conductive layer 170, and the penetration holes are arranged in a lattice pattern. The rest of the plural penetration holes provided in the reflective film 180 are formed above the top surface 140c of the n-type semiconductor layer 140 in a direction vertical to the top surface 140c, and the penetration holes are arranged in a lattice pattern when it is seen as a planer view as shown in FIG. 1.

The diameter of the penetration hole is enough to have a size for forming a conductive body, and the penetration holes having the diameter of 1 µm to 100 µm are used.

The semiconductor light-emitting element 1 is provided with a p-conductive body 200 which is formed by penetrating plural penetration holes provided above the transparent conductive layer 170, which are contained in the plural penetration holes provided in the reflective film 180. The p-conductive body 200 is configured by p-connecting conductors 202 the number of which is the same as the number of the penetration holes provided above the transparent conductive layer 170, and the p-connecting conductors 202 are arranged in a lattice pattern on the transparent conductive layer 170 when they are seen as a planer view as shown in FIG. 1.

Further, the semiconductor light-emitting element 1 is provided with a p-electrode 300 that is laminated on the reflective film 180, at a position facing the transparent conductive layer 170 while the reflective film 180 is interposed therebetween. Each one end of the plural p-connecting conductors 202 configuring the p-conductive body 200 is connected to the transparent conductive layer 170, and the other end thereof is connected to the p-electrode 300.

The semiconductor light-emitting element 1 is provided with an n-conductive body 400 that is formed by penetrating plural penetration holes provided above the top surface 140c, which are contained in the plural penetration holes provided in the reflective film 180. The n-conductive body 400 is configured by n-connecting conductors 402 the number of which is the same as the number of the penetration holes provided above the top surface 140c, and the n-connecting conductors 402 are arranged in a lattice pattern on the top surface 140c.

Further, the semiconductor light-emitting element 1 is provided with an n-electrode 310 laminated on the reflective film 180, at a position facing the top surface 140c while the reflective film 180 is interposed therebetween. Each one end of the plural n-connecting conductors 402 configuring the n-conductive body 400 is connected to the top surface 140c, and the other end thereof is connected to the n-electrode 310.

Furthermore, the semiconductor light-emitting element 1 is provided with the passivation layer 320. The passivation layer 320 is laminated on the n-electrode 310, the p-electrode 300, and the laminated semiconductor layer 100 on which the protective film 180 is not laminated.

As mentioned above, the semiconductor light-emitting element 1 of the exemplary embodiment has a structure in which the p-electrode 300 and the n-electrode 310 are formed on one side as a side opposite to the substrate 110 when it is seen from the laminated semiconductor layer 100.

In the semiconductor light-emitting element 1, the p-electrode 300 is set to be a positive electrode, the n-electrode 310 is set to be a negative electrode, and the light-emitting layer 150 is configured to emit light by applying the current to the laminated semiconductor layer 100 (specifically, the p-type semiconductor layer 160, the light-emitting layer 150 and the n-type semiconductor layer 140) via these electrodes.

Hereinbelow, each component of the semiconductor light-emitting element 1 will be described.

<Substrate>

As the substrate 110, it is not limited as long as a group-III nitride semiconductor crystal is epitaxially grown on the surface of the substrate, and various kinds of substrates can be selectively used. Note that, in the present invention, the substrate 110 is not an essential component.

The semiconductor light-emitting element 1 of the exemplary embodiment is preferably mounted by flip chip attachment so that light is extracted from the substrate 110 side, as mentioned below. Accordingly, it is preferable to have optical transparency to the light emitted from the light-emitting layer 150 in terms of increasing light extraction efficiency, and in particular, it is preferable to use, as the substrate 110, sapphire having a C-plane as a principal plane in terms of increasing the light extraction efficiency. In the case where sapphire is used as the substrate 110, the intermediate layer 120 (buffer layer) may be formed on the C-plane of sapphire.

<Intermediate Layer>

The intermediate layer 120 is preferably composed of polycrystal $Al_xGa_{1-x}N$ (0≤x≤1), and more preferably composed of single crystal $Al_xGa_{1-x}N$ (0≤x≤1). For example, it can be composed of polycrystal $Al_xGa_{1-x}N$ (0≤x≤1) with a thickness of 10 nm to 500 nm. Note that, the intermediate layer 120 has a function that mediates the difference in lattice constant between the substrate 110 and the base layer 130 to facilitate the formation of a single crystal layer which is c-axis oriented on the (0001) plane (C-plane) of the substrate 110. Thus, if the base layer 130 is laminated on the intermediate layer 120, the base layer 130 having more excellent crystallinity can be laminated. Note that, in the present invention, the intermediate layer 120 is not an essential component.

<Base Layer>

As the base layer 130, $Al_xGa_yIn_zN$ (0≤x≤1, 0≤y≤1, 0≤z≤1, x+y+z=1) can be used, but it is preferable to use $Al_xGa_{1-x}N$ (0≤x<1) because the base layer 130 with excellent crystallinity can be formed.

The thickness of the base layer 130 is preferably 0.1 µm or more, and the $Al_xGa_{1-x}N$ layer having excellent crystallinity is likely to be obtained with these layer thickness or more. Further, the thickness of the base layer 130 is preferably 10 µm or less. Note that, the base layer 130 is not an essential component.

<Laminated Semiconductor Layer>

The laminated semiconductor layer 100 formed by containing the group-III nitride semiconductor is configured by laminating, on the substrate 110, the n-type semiconductor layer 140, the light-emitting layer 150 and the p-type semiconductor layer 160 in this order as shown in FIG. 2. Each of the n-type semiconductor layer 140, the light-emitting layer 150 and the p-type semiconductor layer 160 may be configured by plural semiconductor layers.

Here, the n-type semiconductor layer 140 conducts electric conduction as a first conductivity type in which an electron is a carrier, and the p-type semiconductor layer 160 conducts electric conduction as a second conductivity type in which a hole is a carrier.

<N-Type Semiconductor Layer>

The n-type semiconductor layer 140, as an example of a first semiconductor layer having a first conductivity type, is preferably configured with an n-contact layer and an n-cladding layer. Note that the n-contact layer can also serve as the n-cladding layer. Further, the above-mentioned base layer 130 may be included in the n-type semiconductor layer 140.

The n-contact layer is a layer for providing the n-electrode 310. The n-contact layer is preferably configured with an $Al_xGa_{1-x}N$ layer (0≤x<1, preferably 0≤x≤0.5, and more preferably 0≤x≤0.1).

It is preferable to provide the n-cladding layer between the n-contact layer and the light-emitting layer 150. The n-cladding layer is a layer for performing injection of the carriers into the light-emitting layer 150 and confinement of the carriers. Note that, in the description, the composition ratio of each of AlGaN, GaN and GaInN may be omitted in some cases. The n-cladding layer can be formed of AlGaN, GaN, GaInN or the like. Further, the hetero junction structure or the superlattice structure in which the layer is laminated plural times of these structures may also be used. In the case where the n-cladding layer is formed of GaInN, the band gap thereof is desirably larger than that of GaInN of the light-emitting layer 150.

Note that, in the case where the n-cladding layer is a layer containing the superlattice structure, the layer may contain a structure in which an n-side first layer composed of the group-III nitride semiconductor with a thickness of 100 angstrom or less and an n-side second layer having a different composition from the n-side first layer and composed of the group-III nitride semiconductor with a thickness of 100 angstrom or less are laminated.

Further, the n-cladding layer may contain a structure in which the n-side first layers and the n-side second layers are alternately and repeatedly laminated, and the structure is preferably an alternate structure of GaInN and GaN or an alternate structure of GaInN having different compositions.

<Light-Emitting Layer>

As the light-emitting layer 150 laminated on the n-type semiconductor layer 140, a single quantum well structure or a multiple quantum well structure can be employed.

As a well layer having a quantum well structure, the group-III nitride semiconductor layer composed of $Ga_{1-y}In_yN$ ($0<y<0.4$) is usually used. The thickness of the well layer may be the thickness by which quantum effects can be obtained, for example, 1 nm to 10 nm, and preferably 2 nm to 6 nm in terms of light emission output.

Moreover, in the case of the light-emitting layer 150 having the multiple quantum well structure, the above-described $Ga_{1-y}In_yN$ is employed as the well layer, and $Al_zGa_{1-z}N$ ($0 \leq z < 0.3$) having a band gap energy larger than that of the well layer is employed as a barrier layer. The well layer and the barrier layer may be doped or not doped with impurities depending upon a design thereof.

<P-Type Semiconductor Layer>

In the p-type semiconductor layer 160, as an example of a second semiconductor layer having a second conductivity type, a hole is used as a carrier, for example. It is usually configured with a p-cladding layer and a p-contact layer. Further, the p-contact layer can also serve as the p-cladding layer.

The p-cladding layer is a layer performing confinement of carriers within the light-emitting layer 150 and injection of carriers. The p-cladding layer is not particularly limited as long as the band gap energy of the composition thereof is larger than that of the light-emitting layer 150 and carriers can be confined within the light-emitting layer 150, but is preferably composed of $Al_xGa_{1-x}N$ ($0<x\leq 0.4$).

It is preferable that the p-cladding layer is composed of such AlGaN in terms of confinement of carriers within the light-emitting layer 150. The thickness of the p-cladding layer is not particularly limited, but preferably 1 nm to 400 nm, and more preferably 5 nm to 100 nm.

Further, the p-cladding layer may have a superlattice structure in which the layer is laminated plural times of these structures, and preferably has an alternate structure of AlGaN and AlGaN or an alternate structure of AlGaN and GaN.

The p-contact layer is a layer for providing the p-electrode 300. The p-contact layer is preferably composed of $Al_xGa_{1-x}N$ ($0\leq x\leq 0.4$). It is preferable that Al composition is in the above-described range since excellent crystallinity and good ohmic contact with the transparent conductive layer 170 are allowed to be maintained.

The thickness of the p-contact layer is not particularly limited, but is preferably 10 nm to 500 nm, and more preferably 50 nm to 200 nm. It is preferable to provide the thickness of the p-contact layer in these ranges in terms of light emission output.

<Transparent Conductive Layer>

As shown in FIG. 2, the transparent conductive layer 170 as an example of a first transparent conductive layer is laminated on the p-type semiconductor layer 160.

The transparent conductive layer 170 is formed to cover almost all surfaces except for a peripheral end of a top surface 160c of the p-type semiconductor layer 160 a part of which has been removed by etching or the like, for forming the n-electrode 310, when it is seen as a planar views as shown in FIG. 1.

As the transparent conductive layer 170, it is preferable to use one that is able to make an ohmic contact with the p-type semiconductor layer 160, and that has low contact resistance with the p-type semiconductor layer 160. Further, as the transparent conductive layer 170, it is preferable to use one that is excellent in optical transparency since, in the semiconductor light-emitting element 1, the light from the light-emitting layer 150 is extracted from the substrate 110 side through the reflective film 180. Furthermore, in order to uniformly pass an electric current over the entire surface of the p-type conductor layer 160, it is preferable to use the transparent conductive layer 170 having an excellent conductive property and narrow resistance distribution.

Note that, the thickness of the transparent conductive layer 170 can be selected from the range of 2 nm to 500 nm. Here, if the thickness of the transparent conductive layer 170 is thinner than 2 nm, there are some cases in which it becomes hard to make an ohmic contact with the p-semiconductor layer 160. Meanwhile, if the thickness of the transparent conductive layer 170 is thicker than 500 nm, there are some cases in which it is not favorable in terms of optical transparency to the light emitted from the light-emitting layer 150 and the reflected light from the reflective film 180 and the like.

As an example of the transparent conductive layer 170, conductive materials composed of oxides, which are good in optical transparency to the light of the wavelength emitted from the light-emitting layer 150, are used. Particularly, a part of oxides containing In is preferable in the point that both optical transparency and conductive property are superior to other transparent conductive films. Examples of conductive oxides containing In include: IZO (indium zinc oxide ($In_2O_3$—ZnO)); ITO (indium tin oxide ($In_2O_3$—$SnO_2$)); IGO (indium gallium oxide ($In_2O_3$—$Ga_2O_3$)); and ICO (indium cerium oxide ($In_2O_3$—$CeO_2$)). Note that, a dopant such as fluorine may be added to these materials. Further, for example, as oxides not containing In, conductive materials such as carrier-doped $SnO_2$, $ZnO_2$ and $TiO_2$ may be employed.

The transparent conductive layer 170 can be formed by providing these materials by any well-known conventional method in this technical field. By performing thermal annealing after forming the transparent conductive layer 170, optical transmission of the transparent conductive layer 170 is increased, sheet resistance is reduced, and an ohmic contact is secured.

In the exemplary embodiment, as the transparent conductive layer 170, the one having a crystallized structure may be used. In particular, a translucent material containing $In_2O_3$ crystals having a crystal structure of a hexagonal system or a bixbyite structure (for example, IZO or ITO) is preferably used.

Further, as the film used for the transparent conductive layer 170, it is preferable to use a composition showing the lowest specific resistance. For example, a ZnO concentration in IZO is preferably 1 wt % to 20 wt %, more preferably in the range of 5 wt % to 15 wt %, and 10 wt % is especially preferred.

<Reflective Film>

As shown in FIG. 2, the reflective film 180 as an example of a transparent insulating layer is laminated to cover each of the transparent conductive layer 170, the p-type semiconductor layer 160 on which the transparent conductive layer 170 is not laminated, and the n-type semiconductor layer 140 on which the light-emitting layer 150 is not laminated. Further, the reflective film 180 covers not only the surface of each layer in the plane direction but also the side surfaces of the light-emitting layer 150 and the p-type semiconductor layer 160, that is, a section as a wall portion of the step formed by the p-type semiconductor layer 160 and the n-type semiconductor layer 140, and furthermore, the reflective film 180 covers the side surface of the transparent conductive layer 170.

The reflective film 180 shown in FIG. 2 is a single configuration continuing in the plane direction of the laminated semiconductor layer 100.

The reflective film 180 is composed of a material having optical transparency to the light outputted from the light-emitting layer 150, a refractive index lower than that of the transparent conductive layer 170, and an insulating property. Specifically, as the reflective film 180, for example, $SiO_2$ (silicon oxide), $MgF_2$ (magnesium fluoride), $CaF_2$ (calcium fluoride) or $Al_2O_3$ (aluminum oxide) can be used. Note that, in this example, $SiO_2$ (silicon oxide) is used as the reflective film 180.

The reflective film 180 has a function that reflects the light outputted from the light-emitting layer 150, and the thickness H of the reflective film 180 is set as a relation of an equation (1) shown as follows, where the refractive index of the reflective film 180 is set as n, the light emission wavelength of the light-emitting layer 150 is set as λ (nm), and Q is set as a value obtained by dividing the light emission wavelength λ (nm) of the light-emitting layer 150 by 4 times of the refractive index n of the reflective film 180 (Q=λ/4n). However, A is an integer.

[Formula 1]

$$H = AQ \quad (1)$$

The thickness H of the reflective film 180 is more preferably set on the basis of an equation (2) shown as below. That is, the thickness H is more preferably larger than 5λ/4n. In other words, the thickness H is more preferably 5Q or more. In addition, the thickness H is desirably 20Q or less in terms of restriction of the production cost.

[Formula 2]

$$\frac{5\lambda}{4n} < H \quad (2)$$

Further, in the exemplary embodiment, the thickness H of the reflective film 180 is preferably set within the range of inequalities (3) shown as below. However, B is an odd number not less than 3.

$$(B-0.5) \times Q \leq H \leq (B+0.5) \times Q \quad (3)$$

Furthermore, the thickness H of the reflective film 180 preferably has a relation as (B−0.4)×Q≤H≤(B+0.4)×Q, and more preferably has a relation as (B−0.3)×Q≤H≤(B+0.3)×Q.

In addition, B is more preferably an odd number not less than 5, and desirably an odd number not more than 19 in terms of restriction of the production cost.

<Conductive Body>

As shown in FIG. 1 and FIG. 2, each of the p-conductive body 200 and the n-conductive body 400 is provided to penetrate the reflective film 180.

The p-conductive body 200 is formed by the p-connecting conductors 202 as plural connecting conductors on the p-electrode 300 side. The p-connecting conductors 202 each have one end on the substrate 110 side connected to a top surface 170c of the transparent conductive layer 170, and the other end connected to the p-electrode 300.

The n-conductive body 400 is formed by the n-connecting conductors 402 as plural connecting conductors on the n-electrode 310 side. The n-connecting conductors 402 each have one end connected to the top surface 140c of the n-type semiconductor layer 140 and the other end connected to the n-electrode 310.

Note that, for clarification, the scale of the p-connecting conductors 202 and the re-connecting conductors 402 in FIG. 2 is changed, and is greatly different from the dimensions of the p-connecting conductors 202 and the n-connecting conductors 402 in the exemplary embodiment.

In the exemplary embodiment, the p-connecting conductors 202 and the n-connecting conductors 402 preferably have the diameter within the range of 10 μm to 80 μm, and the length (depth) within the range as the thickness H of the reflective film 180. For example, the p-connecting conductors 202 and the n-connecting conductors 402 have the diameter of 10 μm and the length (depth) of 500 nm.

The plural p-connecting conductors 202 are formed in the whole area of the p-electrode 300 as shown in FIG. 1. The current passing through the respective p-connecting conductors 202 becomes the current used for light emission of the light-emitting layer 150.

In the exemplary embodiment, by forming not a single p-connecting conductor 202 but the plural p-connecting conductors 202, a current is uniformly dispersed over the whole surface of the p-type semiconductor layer 160 as the top surface 160c. Thereby, it is possible to improve unevenness of light emission in the light-emitting layer 150.

Also, the plural n-connecting conductors 402 are formed to be distributed to the whole area of the n-electrode 310 as shown in FIG. 1. By forming the plural n-connecting conductors 402, sufficient amount of the current is supplied to the n-type semiconductor layer 140. Thus, it is possible to improve unevenness of light emission in the light-emitting layer 150 and to emit light.

The p-connecting conductors 202 and the n-connecting conductors 402 are provided to the wall surfaces and the bottom surfaces of the penetration holes formed by using a dry etching or liftoff process. Alternatively, they may be formed as penetration holes of the reflective film 180 where a metal is filled. Examples of metal plating or a filled metal include IZO/a silver alloy/Ta or a configuration shown in FIG. 4 or FIG. 5 as an example.

<Electrode>

Next, configurations of the first and second electrodes will be described.

<First Electrode>

Description will be given for the configuration of the n-electrode 310 as an example of a first electrode in the exemplary embodiment.

The n-electrode 310 is laminated on the reflective film 180, and is formed by plural layers. The n-electrode 310 includes: an n-metal reflective layer 311; a first diffusion barrier layer 312 as one example of another metal layer, a second diffusion barrier layer 313, a third diffusion barrier layer 314, a fourth diffusion barrier layer 315 and a first bonding layer 316 which are laminated in this order from the top of the n-metal reflective layer 311 to the above in FIG. 2; and a protective adhesion layer 317 laminated to cover the first bonding layer 316 except for an exposed section of the first bonding layer 316. It is preferable that at least any one of the n-metal reflective layer 311 to the protective adhesion layer 317 is a metal reflective layer since light extraction efficiency can be increased as mentioned below. For example, the n-metal reflective layer 311 is configured as a metal reflective layer composed of Al (aluminum) or an Al alloy.

<Second Electrode>

Description will be given for the configuration of the p-electrode 300 as an example of the second electrode in the exemplary embodiment.

The p-electrode 300 includes: a p-adhesion layer 301 laminated on the reflective film 180; a p-metal reflective layer 302, a first diffusion barrier layer 303, a second diffusion barrier layer 304, a third diffusion barrier layer 305, a fourth diffusion barrier layer 306 and a second bonding layer 307 which are laminated in this order from the top of the p-adhesion layer 301 to the above in FIG. 2; and a protective adhesion layer 308 laminated to cover the second bonding layer 307 except for an exposed section of the second bonding layer 307.

It is preferable that at least any one of the p-metal reflective layer 302 to the protective adhesion layer 308 is a metal reflective layer since light extraction efficiency can be increased as mentioned below. For example, the p-metal reflective layer 302 is configured as a metal reflective layer composed of Ag (silver) or an Ag alloy.

<Passivation Layer>

As shown in FIG. 2, the passivation layer 320 is laminated on the protective adhesion layer 308, the protective adhesion layer 317, the reflective film 180, and the p-type semiconductor layer 160 on which the transparent conductive layer 170 is not laminated. The passivation layer 320 is preferably composed of $SiO_2$ (silicon oxide) or the like. It is possible to reduce the possibility of intrusion of air and water existing at the outside into the light-emitting layer 150 of the semiconductor light-emitting element 1, and to prevent the p-electrode 300 or the n-electrode 310 of the semiconductor light-emitting element 1 from peeling. The thickness of the passivation layer 320 is usually set within the range of 50 nm to 1 μm. If the thickness of the passivation layer 320 is less than 50 nm, the function as the passivation film may be affected, and thereby there is a risk that the light emission output may be decreased in a short period depending on a usage environment.

Figure 3:
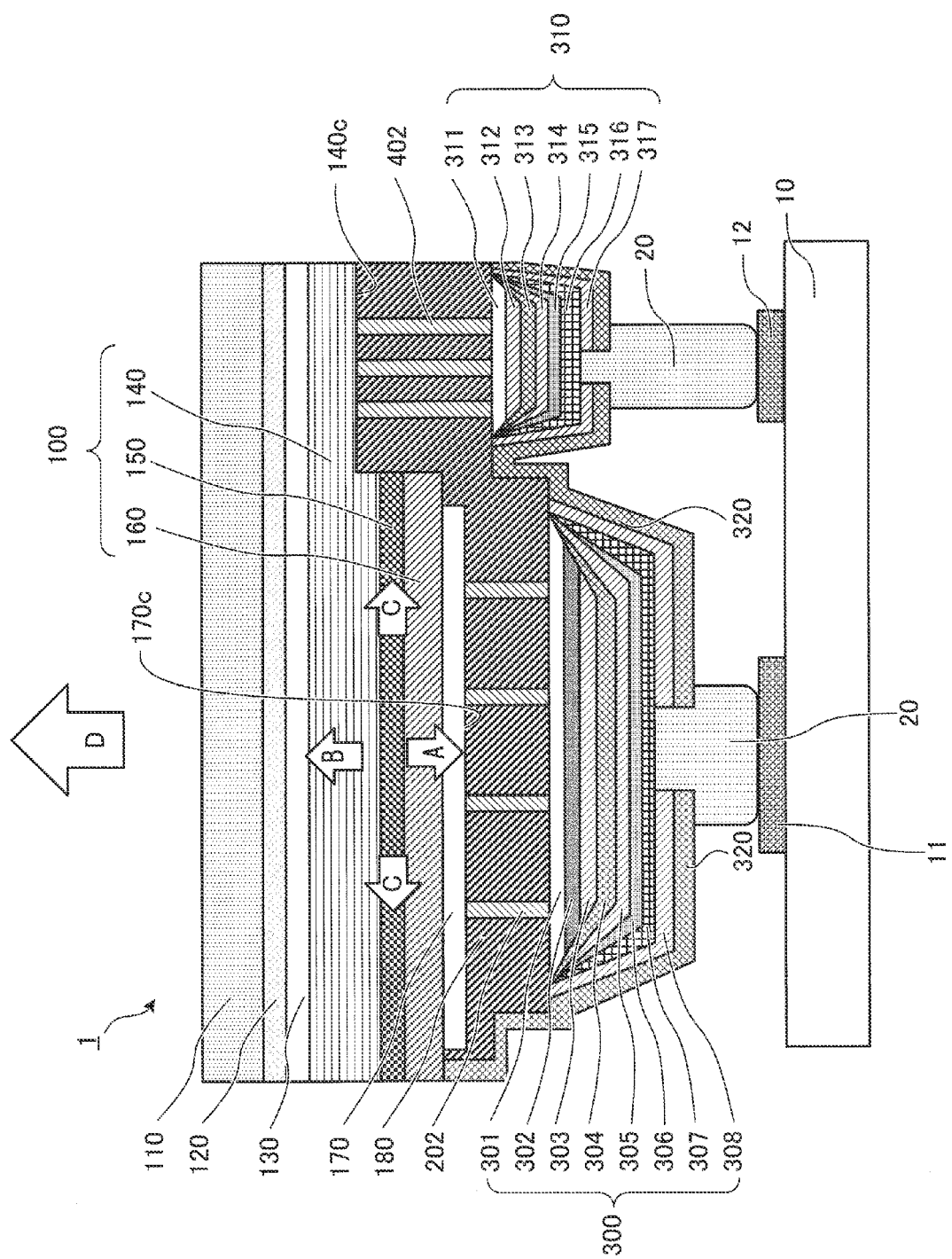
FIG. 3 is a view showing one example of a configuration of a light-emitting device in which the semiconductor light-emitting element is mounted on the wiring board by flip chip attachment.

FIG. 3 is a view showing one example of a configuration of a light-emitting device in which the semiconductor light-emitting element 1 shown in FIG. 2 is mounted on a wiring board 10.

On one surface of the wiring board 10, a positive electrode 11 and a negative electrode 12 are formed. In the state where the upside and the downside of the semiconductor light-emitting element 1 shown in FIG. 2 are reversed with respect to the wiring board 10, the p-electrode 300 and the n-electrode 310 are mechanically fixed to and are electrically connected to the positive electrode 11 and the negative electrode 12 with a solder 20, respectively. Such a connecting method of the semiconductor light-emitting element 1 connected to the wiring board 10 is generally called a flip-chip bonding. In the flip-chip bonding, the substrate 110 of the semiconductor light-emitting element 1 is located at a position farther than that of the light-emitting layer 150 when it is seen from the wiring board 10.

Figure 4:
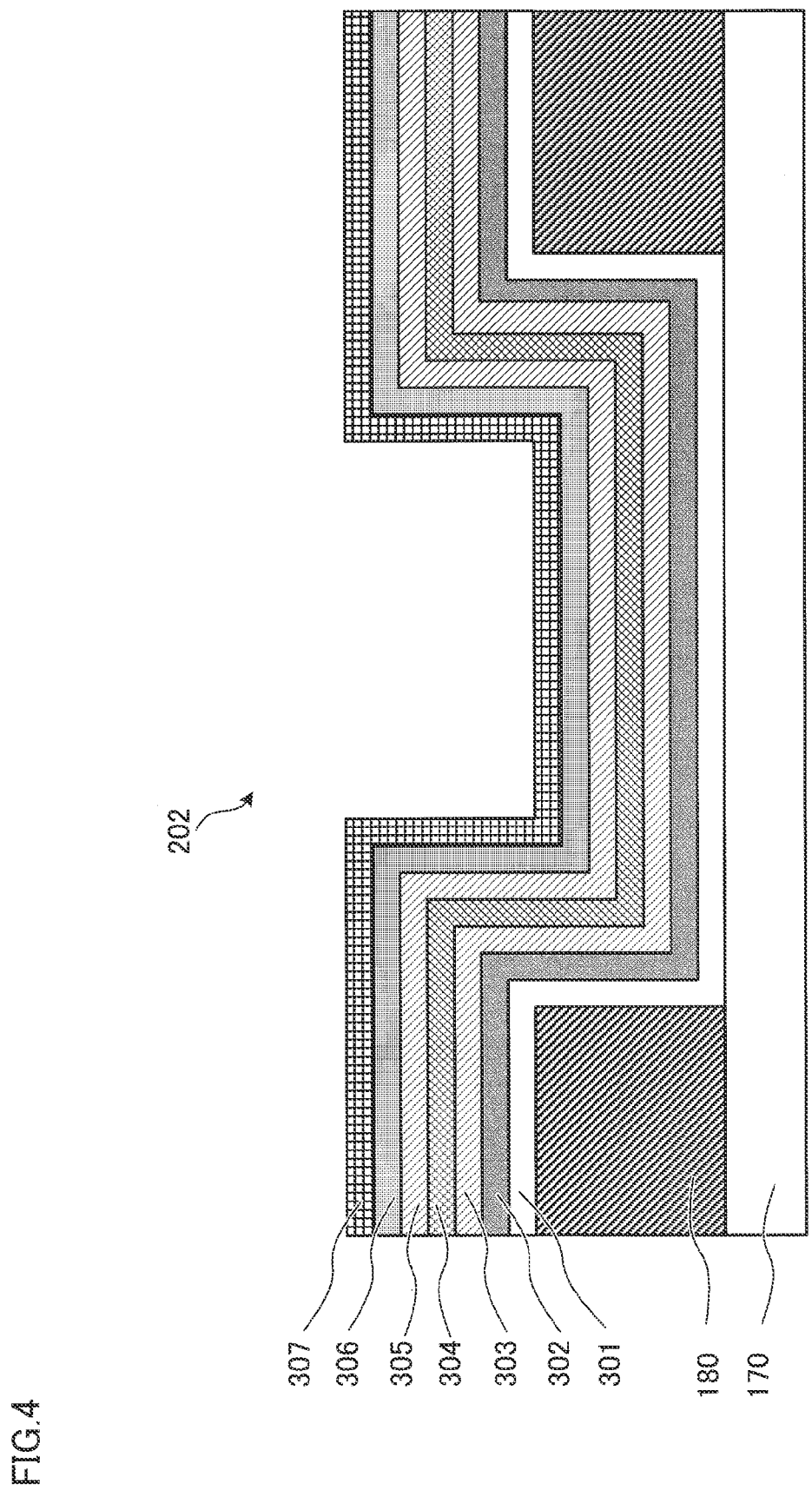
FIG. 4 is a schematic cross-sectional view of the p-connecting conductor.
Figure 5:
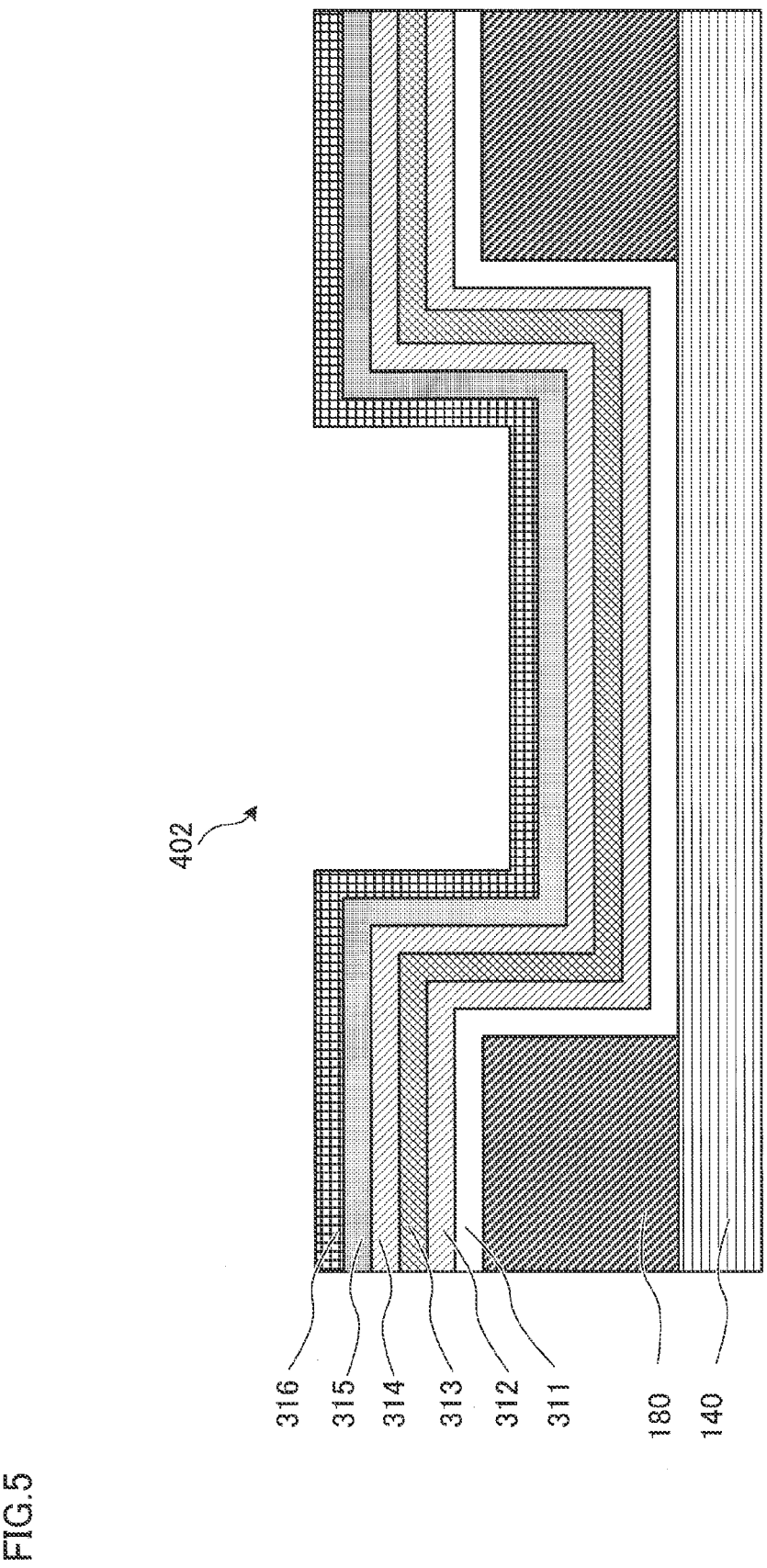
FIG. 5 is a schematic cross-sectional view of the n-connecting conductor.

Next, description will be given for a configuration in which the p-connecting conductors 202 and the n-connecting conductors 402 shown in FIG. 4 and FIG. 5 are formed.

That is, the p-connecting conductor 202 is formed by laminating the respective layers configuring the p-electrode 300 in the penetration hole, and the n-connecting conductor 402 is formed by laminating the respective layers configuring the n-electrode 310 in the penetration hole.

First, description will be given for the p-connecting conductors 202. As shown in FIG. 4, the p-adhesion layer 301 as an example of an outer peripheral layer, the p-metal reflective layer 302 as an example of an inner peripheral layer, the first diffusion barrier layer 303, the second diffusion barrier layer 304, the third diffusion barrier layer 305, the fourth diffusion barrier layer 306 and the second bonding layer 307, which are the layers for forming the p-electrode 300, are laminated in the penetration hole in this order, and thereby the p-connecting conductor 202 is formed.

Note that, as shown in FIG. 4, if the p-electrode 300 and the p-connecting conductor 202 are formed of plural layers continuing in the plane direction, the light extraction efficiency is improved.

On the other hand, description will be given for the n-connecting conductor 402. As shown in FIG. 5, the n-metal reflective layer 311, the first diffusion barrier layer 312, the second diffusion barrier layer 313, the third diffusion barrier layer 314, the fourth diffusion barrier layer 315, and the first bonding layer 316, which are layers for forming the n-electrode 310, are laminated in this order, and thereby the n-connecting conductor 402 is formed. The first to fourth diffusion barrier layers (312 to 315) may be formed of at least one layer depending on the material configuration. Before forming the n-metal reflective layer 311, the n-adhesion layer may be formed as mentioned above.

Note that, as shown in FIG. 5, if the n-electrode 310 and the n-connecting conductor 402 are formed of plural layers continuing in the plane direction, the light extraction efficiency is improved.

As shown in FIG. 4 and FIG. 5, in the case where the p-connecting conductor 202 is formed by laminating the respective layers configuring the p-electrode 300 in the penetration hole and the n-connecting conductor 402 is formed by laminating the respective layers configuring the n-electrode 310 in the penetration hole, it is considered that the respective layers are configured as follows, for example.

Note that, in the following configuration, since the respective layers of the p-electrode 300 correspond to those of the p-connecting conductor 202, the p-electrode 300 and the p-connecting conductor 202 will be collectively described below. In the same reason, the n-electrode 310 and the n-connecting conductor 402 will be collectively described below.

<P-Connecting Conductor>

Each of the p-connecting conductor 202 and the p-electrode 300 has the p-adhesion layer 301, the p-metal reflective layer 302 laminated on the p-adhesion layer 301, the first diffusion barrier layer 303, the second diffusion barrier layer 304, the third diffusion barrier layer 305, and the forth diffusion barrier layer 306 which are laminated on the p-metal reflective layer 302, and the second bonding layer 307.

<Adhesion Layer>

In the p-connecting conductor 202, the p-adhesion layer 301 as an example of a second transparent conductive layer is laminated on the transparent conductive layer 170 as shown in FIG. 4. Thus, it is preferable to use a material having good adhesiveness with respect to the transparent conductive layer 170. Note that, in the case where the p-adhesion layer 301 is not provided and the p-metal reflective layer 302 (for example, silver) is directly laminated on the reflective film 180, the adhesiveness is greatly decreased in comparison with the case where the p-adhesion layer 301 is provided.

On the other hand, in the p-electrode 300 as a whole, although the p-adhesion layer 301 is not directly laminated on the top surface 160c of the p-type semiconductor layer 160 a part of which has been removed by etching or the like for forming the n-electrode 310, the p-adhesion layer 301 is formed at a position to cover the almost all surface of the top surface 160c of the p-type semiconductor layer 160 except for the peripheral end portion when it is seen as a planar view as shown in FIG. 1. Since the p-adhesion layer 301 is laminated on the reflective film 180, it is preferable to use a material having good adhesiveness with respect to the reflective film 180. In addition, in the semiconductor light-emitting element 1, the light from the light-emitting layer 150 which has passed through the reflective film 180 is extracted to the substrate 110 side via the p-metal reflective layer 302 and the like, and thus it is preferable that a material excellent in optical transparency is used as the p-adhesion layer 301. Further, in order to evenly diffuse the current over the whole surface of the p-type semiconductor layer 160, it is preferable that a material excellent in the conductive property and having a less resistance distribution is used as the p-adhesion layer 301.

From these points, a transparent conductive layer is exemplified as the p-adhesion layer 301. For example, in the exemplary embodiment, a conductive material composed of a metal oxide, which is good in optical transparency to the light of the wavelength emitted from the light-emitting layer 150, is used as the p-adhesion layer 301. In particular, the metal oxide containing In is preferable in the point that both optical transparency and conductive property are superior to other transparent conductive films. Examples of a conductive metal oxide containing In include: ITO (indium tin oxide ($In_2O_3$—$SnO_2$)); IZO (indium zinc oxide ($In_2O_3$—$ZnO$)); IGO (indium gallium oxide ($In_2O_3$—$Ga_2O_3$)); and ICO (indium cerium oxide ($In_2O_3$—$CeO_2$)), for example. A particularly preferable example is IZO (indium zinc oxide ($In_2O_3$—$ZnO$)). However, IZO configuring the p-adhesion layer 301 is not processed by a heat treatment, and remains in an amorphous state.

It is preferable that the thickness of the p-adhesion layer 301 is within the range of 1 nm to 50 nm because of the above-mentioned reason. In the case where the thickness is less than 1 nm, there are some cases in which the adhesiveness with respect to the transparent conductive layer 170 is deteriorated, and the contact resistance is increased. In the case where the thickness is larger than 50 nm, the optical transparency is decreased and the serial resistance is increased, and thereby increase of forward voltage Vf in the light-emitting element is lead. For example, the thickness of the p-adhesion layer 301 is 2 nm.

<Metal Reflective Layer>

On the p-adhesion layer 301, the p-metal reflective layer 302 as an example of a metal reflective layer is laminated.

In the p-electrode 300, as shown in FIG. 2 as a planer view, the p-metal reflective layer 302 is formed to cover the whole area of the p-adhesion layer 301. The central portion of the p-metal reflective layer 302 has a constant thickness and is formed substantially flat, whereas, the end portion side of the p-metal reflective layer 302 is formed to be inclined with respect to a top surface 180c of the reflective film 180 on the p-electrode side due to gradual reduction of the thickness thereof. Moreover, the p-metal reflective layer 302 is formed on the p-adhesion layer 301, and is not configured to be formed on the reflective film 180. In other words, the reflective film 180 and the p-metal reflective layer 302 are configured not to be in direct contact with each other. In addition, as mentioned below, the p-metal reflective layer 302 also has a function that feeds power to the p-type semiconductor layer 160 via the p-adhesion layer 301 and the like. Accordingly, it is necessary to keep the resistance value low and the contact resistance with the p-adhesion layer 301 low.

The p-metal reflective layer 302 in the exemplary embodiment is composed of a metal such as Ag (silver), Pd (palladium), Cu (copper), Nd (neodymium), Al (aluminum), Ni (nickel), Cr (chrome) or the like or an alloy containing at least one of these metals. In particular, in the case where silver or a silver alloy is used as the p-metal reflective layer 302, it is preferable since high light reflectance is given with respect to light of the wavelength within the range from blue to green emitted from the light-emitting layer 150.

Here, in the case where silver is used as the p-metal reflective layer 302, there are some cases in which heat resistance and high-temperature and high-humidity resistance are not sufficient depending on the usage environment, and thus a silver alloy is preferably used.

Therefore, in the case where silver is used as the p-metal reflective layer 302, a transparent conductive material such as IZO is preferably used as a material of the p-adhesion layer 301. Here, in the case where the p-adhesion layer 301 is not provided and the p-metal reflective layer 302 (for example, silver) is directly laminated on the reflective film 180, the adhesiveness is greatly decreased in comparison with the case where the p-adhesion layer 301 is provided. In addition, the transparent conductive material such as IZO has good adhesiveness with the transparent conductive layer 170 which is open to the atmosphere.

The thickness of the p-metal reflective layer 302 is preferably within the range of 80 nm to 200 nm. In the case where the thickness is less than 80 nm, reflectance of the p-metal reflective layer 302 is decreased. Meanwhile, in the case where the thickness is larger than 200 nm, it is not preferable since production cost of the light-emitting element is increased.

<Diffusion Barrier Layer>

As shown in FIG. 2, the first diffusion barrier layer 303 is laminated on the p-metal reflective layer 302. The second diffusion barrier layer 304, the third diffusion barrier layer 305 and the fourth diffusion barrier layer 306 are laminated on the first diffusion barrier layer 303, the second diffusion barrier layer 304 and the third diffusion barrier layer 305, respectively.

The first diffusion barrier layer 303, the second diffusion barrier layer 304 and the third diffusion barrier layer 305 suppress diffusion of a metal (in this specific example, Ag (silver)) composing the p-metal reflective layer 302 which is in the contact state and a metal (in this specific example, Pt (platinum)) composing the fourth diffusion barrier layer 306.

Further, the fourth diffusion barrier layer 306 suppresses diffusion of a metal (in this specific example, Ta (tantalum)) composing the third diffusion barrier layer 305 which is in the contact state and a metal (in this specific example, Au (gold)) composing the second bonding layer 307.

In the p-electrode 300, the first diffusion barrier layer 303, the second diffusion barrier layer 304, the third diffusion barrier layer 305 and the fourth diffusion barrier layer 306 are formed to cover the whole area of the p-metal reflective layer 302 when they are seen as a planer view as shown in FIG. 2. The central portion of each of the diffusion barrier layers 303 to 306 has a constant thickness and is formed substantially flat, whereas, the end portion side thereof is formed to be inclined with respect to the top surface 180c of the reflective film 180 on the p-electrode side due to gradual reduction of the thickness thereof. Moreover, the diffusion barrier layers 303 to 306 are formed on the p-metal reflective layer 302, and are not configured to be formed on the reflective film 180. In other words, the reflective film 180 and each of the diffusion barrier layers 303 to 306 are configured not to be in direct contact with each other.

As each of the diffusion barrier layers 303 to 306, a layer that makes an ohmic contact with layers being in contact therewith and has low contact resistance with the layers being in contact therewith is preferably used. However, since it is not necessary for each of the diffusion barrier layers 303 to 306 to have a function that transmits the light from the light-emitting layer 150 basically, it is not necessary to have optical transparency unlike the aforementioned p-adhesion layer 301. In addition, since each of the diffusion barrier layers 303 to 306 also has a function that feeds power to the p-type semiconductor layer 160 via the p-metal reflective layer 302 and the p-adhesion layer 301, the layer that is excellent in the conductive property and has less resistance distribution is preferably used as each of the diffusion barrier layers 303 to 306.

In the exemplary embodiment, Ta (tantalum), TaN (tantalum nitride), Ta (tantalum) and Pt (platinum) are used as the first diffusion barrier layer 303, the second diffusion barrier layer 304, the third diffusion barrier layer 305 and the fourth diffusion barrier layer 306, respectively. Note that, the third diffusion barrier layer 305 may be composed of Ti (titanium) or Ni (nickel).

The thickness of the first diffusion barrier layer 303 is preferably within the range of 20 nm to 200 nm. In the case where the thickness is less than 20 nm, a barrier property to suppress diffusion of the p-metal reflective layer 302 (in this specific example, an Ag (silver) alloy) and the fourth diffusion barrier layer 306 (in this specific example, Pt (platinum)) is insufficient, and there are some cases in which Ag and Pt react with each other in this specific example. Meanwhile, in the case where the thickness is larger than 200 nm, production cost of the light-emitting element is increased.

The thickness of the second diffusion barrier layer 304 is preferably within the range of 1 nm to 50 nm. In the case where the thickness is less than 1 nm, adhesiveness with the adjacent diffusion barrier layers is decreased. In the case where the thickness is larger than 50 nm, since the serial resistance increases, increase of the forward voltage Vf of the light-emitting element is lead. Note that, the second diffusion barrier layer 304 is not an essential component.

The thickness of the third diffusion barrier layer 305 is preferably within the range of 20 nm to 500 nm. In the case where the thickness is less than 20 nm, adhesiveness between the second diffusion barrier layer 304 and the fourth diffusion barrier layer 306 is deteriorated. In addition, a barrier property to suppress diffusion of the p-metal reflective layer 302 (in this specific example, Ag (silver)) and the fourth diffusion barrier layer 306 (in this example, Pt (platinum)) is insufficient, there are some cases in which Ag and Pt react with each other in this specific example. Meanwhile, in the case where the thickness is larger than 500 nm, production cost of the light-emitting element is increased.

The thickness of the fourth diffusion barrier layer 306 is preferably within the range of 50 nm to 200 nm. In the case where the thickness is less than 50 nm, there are some cases in which the third diffusion barrier layer 305 (for example, Ta) and the second bonding layer 307 (for example, Au) react with each other. Meanwhile, in the case where the thickness is larger than 200 nm, production cost of the light-emitting element is increased.

<Second Bonding Layer>

On the top surface of the fourth diffusion barrier layer 306, the second bonding layer 307 is laminated to cover the fourth diffusion barrier layer 306.

In the p-electrode 300, the second bonding layer 307 is formed to cover the whole area of the fourth diffusion barrier layer 306 when it is seen as a planar view as shown in FIG. 1. The central portion of the second bonding layer 307 has a constant thickness and is formed substantially flat, whereas, the end portion side of the second bonding layer 307 is formed to be inclined with respect to the top surface 180c of the reflective film 180 on the p-electrode side due to gradual reduction of the thickness thereof.

For example, in the case where the second bonding layer 307 is a multi-layer structure, at least one metal layer that is in contact with the innermost side, that is, the fourth diffusion barrier layer 306 and the like, is provided. As the outermost metal layer located at the outermost side, Au (gold) is used in general. In the exemplary embodiment, a single-layered film of Au (gold) is used as the second bonding layer 307.

The thickness of the second bonding layer 307 is preferably within the range of 100 nm to 2 µm. In the case where the thickness is less than 100 nm, resistance of the second bonding layer 307 is increased. Meanwhile, in the case where the thickness is larger than 2 µm, production cost of the light-emitting element is increased.

<Protective Adhesion Layer>

On the top surface and the side surface of the second bonding layer 307, the protective adhesion layer 308 is laminated to cover the second bonding layer 307 except for one part of the second bonding layer 307.

In the p-electrode 300, the protective adhesion layer 308 is formed to cover the area of the second bonding layer 307 except for an exposed section when it is seen as a planar view. The central portion of the protective adhesion layer 308 has a constant thickness and is formed substantially flat, whereas, the end portion side of the protective adhesion layer 308 is formed to be inclined with respect to the top surface 180c of the reflective film 180 on the p-electrode side. The end portion of the protective adhesion layer 308 on the side surface side is provided to be in contact with the top surface 180c of the reflective film 180 on the p-electrode side.

The protective adhesion layer 308 is provided for increasing mechanical adhesiveness between the second bonding layer 307 composed of Au (gold) and the passivation layer 320. In the exemplary embodiment, the protective adhesion layer 308 is composed of Ta (tantalum). Note that, the protective adhesion layer 308 may be composed of Ti (titanium).

The thickness of the protective adhesion layer 308 is preferably within the range of 5 nm to 50 nm. In the case where the thickness is less than 5 nm, adhesiveness between the second bonding layer 307 and the passivation layer 320 is deteriorated. Meanwhile, in the case where the thickness is larger than 20 nm, processing time becomes long in the etching process, and thereby production cost of the semiconductor light-emitting element 1 is increased.

<N-Electrode>

Next, description will be given for the configuration of the n-electrode 310.

The n-electrode 310 includes: the n-metal reflective layer 311; the first diffusion barrier layer 312, the second diffusion barrier layer 313, the third diffusion barrier layer 314 and the fourth diffusion barrier layer 315 which are laminated on the n-metal reflective layer 311; the first bonding layer 316; and the protective adhesion layer 317 laminated on the first bonding layer 316 except for the aforementioned exposed section of the first bonding layer 316. Any of the first diffusion barrier layer 312 to the fourth diffusion barrier layer 315 may be omitted depending on the material configuration.

<Metal Reflective Layer>

In the n-connecting conductor 402, the n-metal reflective layer 311 is laminated on the n-type semiconductor layer 140 as shown in FIG. 5. Thus, a material having good adhesiveness with the n-type semiconductor layer 140 is preferable.

On the other hand, in the n-electrode 310 as a whole, the n-metal reflective layer 311 is formed on the reflective film 180 that covers almost all area of the top surface 140c of the n-type semiconductor layer 140 as shown in FIG. 2. The central portion of the n-metal reflective layer 311 has a constant thickness and is formed substantially flat, whereas, the end portion side of the n-metal reflective layer 311 is formed to be inclined with respect to a top surface 180d of the reflective film 180 on the n-electrode side due to gradual reduction of the thickness thereof. Since the n-metal reflective layer 311 is laminated on the reflective film 180, it is preferable to use a material having good adhesiveness with the reflective film 180. Al or an Al alloy that is preferably used as the n-metal reflective layer 311 has good adhesiveness with $SiO_2$ that is preferably used as the reflective film 180.

Before the n-metal reflective layer 311 is formed, an-adhesion layer may be formed although it is omitted in FIG. 2 and FIG. 5. As the adhesion layer, a material same as the p-adhesion layer 301 can be used.

The n-metal reflective layer 311 may be composed of a metal such as Al (aluminum), Ni (nickel), Nd (neodymium) or Ag (silver) or an alloy including at least one of these metals. Note that, as mentioned below, since the n-metal reflective layer 311 also has a function that feeds power to the n-type semiconductor layer 140, the resistance thereof is preferably low.

The thickness of the n-metal reflective layer 311 is preferably within the range of 80 nm to 200 nm. In the case where the thickness is less than 80 nm, reflectance as the reflecting layer is decreased. Meanwhile, in the case where the thickness is larger than 200 nm, production cost of the semiconductor light-emitting element 1 is increased.

<Diffusion Barrier Layer and the Like>

In the exemplary embodiment, since the configurations of the diffusion barrier layers 312 to 315, the first bonding layer 316 and the protective adhesion layer 317 in the n-electrode 310 are the same as those of the diffusion barrier layers 303 to 306, the second bonding layer 307 and the protective adhesion layer 308, respectively, as for description regarding these configurations, the aforementioned description about the n-electrode 310 should be seen. Note that, in the example to be described later, the formation of the second diffusion barrier layer 313 is omitted.

The semiconductor light-emitting element 1 of the present invention having such a configuration as mentioned above can be produced by a following method. For example, the semiconductor light-emitting element 1 shown in FIG. 1 provides a production method including: a semiconductor layer forming process in which the laminated semiconductor layer 100 is formed on the substrate 110; a transparent conductive layer forming process in which the transparent conductive layer 170 having a conductive property and optical transparency to the light outputted from the light-emitting layer 150 on the laminated semiconductor layer 100; an n-type semiconductor layer exposing process in which the top surface 140c of the n-type semiconductor layer 140 exposed by cutting out the transparent conductive layer 170, and a part of the laminated p-type semiconductor layer 160, the light-emitting layer 150 and the n-type semiconductor layer 140 is formed; a reflective film forming process in which the reflective film 180 is laminated on the transparent conductive layer 170, the p-type semiconductor layer 160 on which the transparent conductive layer 170 is not laminated, and the n-type semiconductor layer 140 that is exposed and is not laminated on the light-emitting layer 150; a penetration hole forming process in which plural penetration holes are formed in the reflective film 180; a process in which the p-conductive body 200 is formed by penetrating the plural penetration holes provided above the transparent conductive layer 170 contained in the plural penetration holes provided in the reflective film 180; and a process in which the n-conductive body 400 is formed by penetrating the plural penetration holes provided above the top surface 140c contained in the plural penetration holes provided in the reflective film 180.

Further, the production method of the present invention has processes for forming the second electrode (p-electrode 300) and the first electrode (n-electrode 310) in the corresponding processes for forming the p-conductive body 200 and the n-conductive body 400.

Furthermore, in the present invention, a forming process of the protective adhesion layer 317 laminated to cover the first bonding layer 316 except for the exposed section of the first bonding layer 316 is included. Also, a forming process of the protective adhesion layer 308 laminated to cover the second bonding layer 307 except for the exposed section of the second bonding layer 307 is included.

Still furthermore, after the aforementioned forming processes of the protective adhesion layers 308 and 317, a process for laminating the passivation layer 320 for protecting the protective adhesion layer 308, the protective adhesion layer 317, the reflective film 180 and the p-type semiconductor layer 160 on which the transparent conductive layer 170 is not laminated is included.

Next, a light-emitting operation using the light-emitting device shown in FIG. 3 will be described.

When a current travelling from the positive electrode 11 to the negative electrode 12 flows through the semiconductor light-emitting element 1 via the positive electrode 11 and the negative electrode 12 of the wiring board 10, in the semiconductor light-emitting element 1, a current from the p-electrode 300 to the n-electrode 310 via the p-conductive body 200, the transparent conductive layer 170, the p-type semiconductor layer 160, the light-emitting layer 150, the n-type semiconductor layer 140 and the n-conductive body 400 flows. Consequently, the light-emitting layer 150 emits light in four directions. In FIG. 3, light toward the p-electrode 300 side in an arrow A direction, light toward the substrate 110 side in an arrow B direction and light toward the sides in arrow C directions are exemplified.

Note that, although the semiconductor light-emitting element 1 is provided with the reflective film 180 having an insulating property between the p-electrode 300 or the n-electrode 310 and the laminated semiconductor layer 100, it is possible to make the current which is necessary for light emission of the light-emitting layer 150 flow by providing the p-conductive body 200 and the n-conductive body 400 to penetrate the reflective film 180. Moreover, at this time, in the p-electrode 300, a current flows via the second bonding layer 307, the fourth diffusion barrier layer 306, the third diffusion barrier layer 305, the second diffusion barrier layer 304, the first diffusion barrier layer 303, the p-metal reflective layer 302 and the p-adhesion layer 301, and a current in a state where the unevenness is suppressed on the top surface 160c is supplied to the p-type semiconductor layer 160.

First, of the light emitted from the light-emitting layer 150, the light travelling toward the reflective film 180 side in the arrow A direction reaches the reflective film 180 via the p-type semiconductor layer 160 and the transparent conductive layer 170, and is reflected by the reflective film 180. Then, the light reflected by the reflective film 180 transmits the transparent conductive layer 170, the p-type semiconductor layer 160, the light-emitting layer 150, the n-type semiconductor layer 140, the base layer 130, the intermediate layer 120 and the substrate 110, and is mainly outputted to an arrow D direction shown in FIG. 3, that is, the outside of the semiconductor light-emitting element 1.

Next, of the light outputted from the light-emitting layer 150, light travelling toward the substrate 110 side in the arrow B direction transmits the n-type semiconductor layer 140, the base layer 130, the intermediate layer 120 and the substrate 110, and is mainly outputted to the arrow D direction shown in FIG. 3, that is, the outside of the semiconductor light-emitting element 1. However, a part of light directly travelling from the light-emitting layer 150 toward the substrate 110 returns to the inside of the semiconductor light-emitting element 1. This is because light travelling from the light-emitting layer 150 toward the substrate 110 side is likely to be reflected at the boundary between the intermediate layer 120 and the substrate 110 by, for example, difference between the refractive indexes of the intermediate layer 120 and the substrate 110.

The light returning to the inside of the semiconductor light-emitting element 1 reaches the reflective film 180 via the n-type semiconductor layer 140 or the n-type semiconductor layer 140, the p-type semiconductor layer 160 and the transparent conductive layer 170, and is reflected by the reflective film 180. Then, the light proceeds to the inside of the semiconductor light-emitting element 1, travels to the substrate 110 side again, and is consequently outputted to the arrow D direction shown in FIG. 3, that is, the outside of the semiconductor light-emitting element 1.

Here, specifically, the light reflected by the reflective film 180 is configured with light reflected at the boundary between the transparent conductive layer 170 and the reflective film 180 and light reflected at the boundary between the reflective film 180 and the p-adhesion layer 301. As mentioned below, the light reflected at the boundary between the transparent conductive layer 170 and the reflective film 180 and the light reflected at the boundary between the reflective film 180 and the p-adhesion layer 301 are enhanced with each other, thereby to increase the light outputted to the outside of the semiconductor light-emitting element 1, and consequently it is considered that the light extraction efficiency of the semiconductor light-emitting element 1 is further improved.

Of the light emitted from the light-emitting layer 150, the light travelling toward the sides in the arrow C directions reaches the reflective film 180 via the light-emitting layer 150 for example, and is reflected at the reflective film 180. Then, the light reflected by the reflective film 180 proceeds to the inside of the semiconductor light-emitting element 1, and is outputted to the arrow D direction shown in FIG. 3, that is, the outside of the semiconductor light-emitting element 1.

Here, as mentioned above, the light returning to the inside of the semiconductor light-emitting element 1 travels toward not only the p-electrode 300 side but also the direction to the n-electrode 310. In the exemplary embodiment, the reflective film 180 is also provided to the n-electrode 310 side, and it is also possible to reflect the light returning to the semiconductor light-emitting element 1 on the n-electrode 310 side.

Further, in the case where the metal reflective layer is provided as one layer of each of the p-electrode 300 and the n-electrode 310, even though all light cannot be reflected by the reflective film 180, the light is reflected by the metal reflective layer, and thereby it is possible to output the light to the outside of the semiconductor light-emitting element 1. Consequently, it is possible to further increase the light extraction efficiency from the semiconductor light-emitting element 1.

As mentioned above, in the exemplary embodiment, the reflective film 180 is provided to the semiconductor light-emitting element 1, and the light emitted from the light-emitting layer 150 to the side opposite to the substrate 110 and the light travelling toward the direction other than the outside of the semiconductor light-emitting element 1 due to reflection at the various boundaries or the like are reflected by the reflective film 180. Further, in the case where the p-electrode 300 and the n-electrode 310 each have the metal reflective layer, these lights are also reflected by the metal reflective layer. Then, the reflected light is outputted to the outside of the semiconductor light-emitting element 1, and thereby the light extraction efficiency from the semiconductor light-emitting element 1 is increased.

Note that, in the above configuration, although the p-connecting conductors 202 and the n-connecting conductors 402 are provided by forming the penetration holes, it should not be interpreted to limit such a configuration. For example, the p-connecting conductors 202 and the n-connecting conductors 402 which are formed into a cylinder may be formed before the reflective film 180 is laminated, or the p-connecting conductors 202 and the n-connecting conductors 402 may be formed by embedding a metal material such as copper after laminating the reflective film 180.

Further, the p-connecting conductors 202 and the n-connecting conductors 402 may have the same configuration or different configurations. The shape of the p-connecting conductors 202 and the n-connecting conductors 402 is not limited to the cylinder, and may be a polygonal column containing a triangle pole.

Figure 6A:
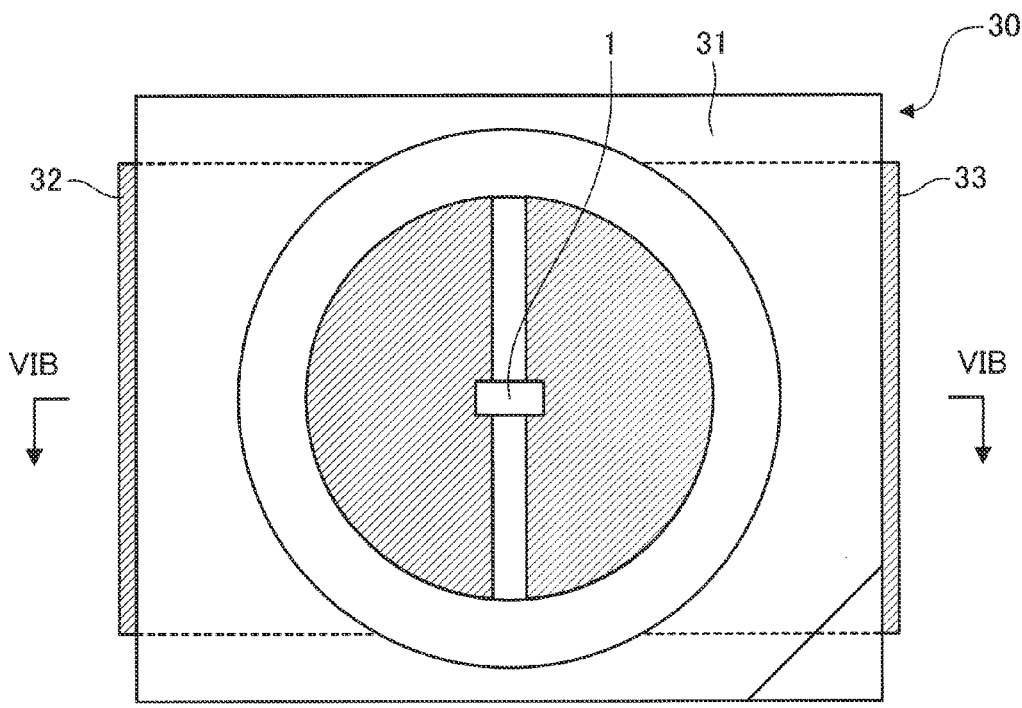
FIGS. 6A and 6B are views showing an example of a configuration of the light-emitting device (lamp) that is provided with the semiconductor light-emitting element shown in FIG. 1.
Figure 6B:
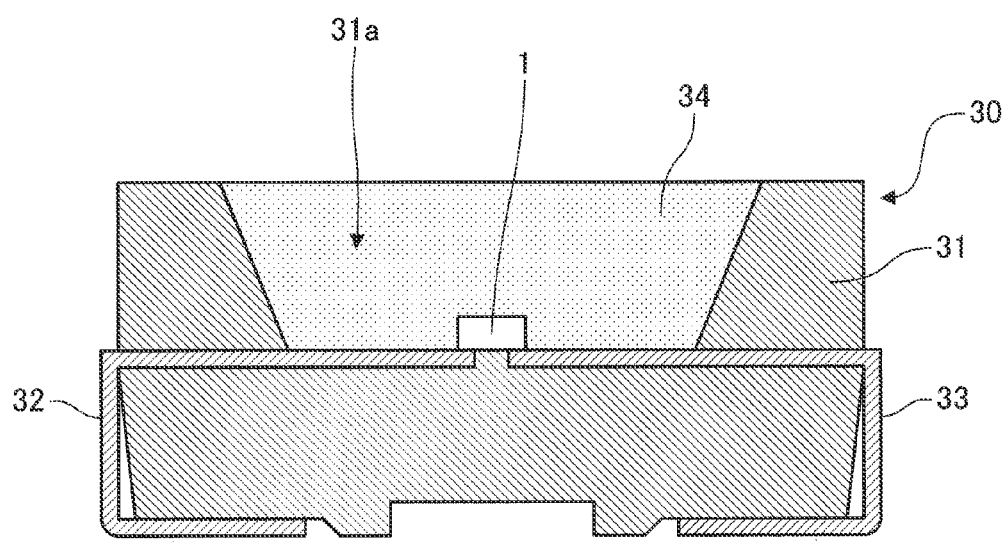

FIGS. 6A and 6B are views showing an example of a configuration of a light-emitting device 30 (also referred to as a light-emitting chip 30 or lamp 30) that is provided with the semiconductor light-emitting element 1 shown in FIG. 1. Here, FIG. 6A shows a top view of the light-emitting chip 30, and FIG. 6B shows a cross-sectional view taken along a line VIB-VIB in FIG. 6A.

This light-emitting chip 30 is provided with: a chassis 31 having a concave portion 31a on one side; a first lead portion 32 and a second lead portion 33 formed by a lead frame formed in the chassis 31; a semiconductor light-emitting element 1 attached to the bottom surface of the concave portion 31a; and a sealing portion 34 that is provided to cover the concave portion 31a. Note that, in FIG. 6A, the illustration of the sealing portion 34 is omitted.

The chassis 31 as an example of a base portion is formed by injection molding using a white thermoplastic resin at the metallic lead portion containing the first lead portion 32 and the second lead portion 33.

Each of the first lead portion 32 and the second lead portion 33 is a metal plate having the thickness of around 0.1 to 0.5 mm, and is composed of a metal that is excellent in workability and thermal conductivity such as an iron/copper alloy as a base, and a plating layer laminated thereon with a thickness of a few μm, such as nickel, titanium, gold, silver or the like. Further, in the exemplary embodiment, a part of the first lead portion 32 and the second lead portion 33 is configured to be exposed at the bottom surface of the concave portion 31a. Furthermore, the each one end side of the first lead portion 32 and the second lead portion 33 is exposed to the outside of the chassis 31, and is bent from the outer wall surface of the chassis 31 to the rear surface side. Note that, in the exemplary embodiment, the first lead portion 32 functions as a first wiring, and the second lead portion 33 functions as a second wiring.

The semiconductor light-emitting element 1 is attached to the concave portion 31a to stride between the first lead portion 32 and the second lead portion 33.

The sealing portion 34 is composed of a transparent resin having high optical transmittance to the wavelength within the visible range and high refractive index. As a resin composing the sealing portion 34, which satisfies characteristics such as heat resistance, weather resistance and mechanical strength, an epoxy resin or a silicon resin can be used, for example. Further, in the exemplary embodiment, a phosphor that converts a part of the light emitted from the semiconductor light-emitting element 1 into a green light and a red light is contained in the transparent resin forming the sealing portion 34. Note that, instead of the phosphor, a phosphor that converts a part of a blue light into a yellow light, or a phosphor that converts a part of a blue light into a yellow light and a red light may be contained therein.

Note that, electronic devices such as back lights, cell phones, displays, a various kinds of panels, computers, game machines and illuminations in which the light-emitting chip 30 in the exemplary embodiment is embedded, or mechanical devices such as an automobile into which these electronic devices are embedded are each provided with the semiconductor light-emitting element 1 that is excellent in light emission characteristics. In particular, in the electronic devices such as back lights, cell phones, displays, game machines and illuminations, which are driven by a battery, it is preferable because excellent products having the semiconductor light-emitting element 1 that is excellent in light emission characteristics can be provided. Further, the configuration of the light-emitting chip 30 having the semiconductor light-emitting element 1 is not limited to the one shown in FIG. 6A and FIG. 6B, and may adopt a package configuration called a bullet type, for example.

EXAMPLES

Next, description will be given for examples of the present invention. However, the present invention is not limited to these examples.

Example 1

First, the inventor conducted an experiment for evaluating adhesiveness in the case where $SiO_2$ (silicon oxide) was used as the reflective film 180 and an Ag (silver) alloy composed of Ag—Pd—Cu was used as the p-metal reflective layer 302. The experimental result will be described with reference to FIGS. 7A and 7B.

Figure 7A:
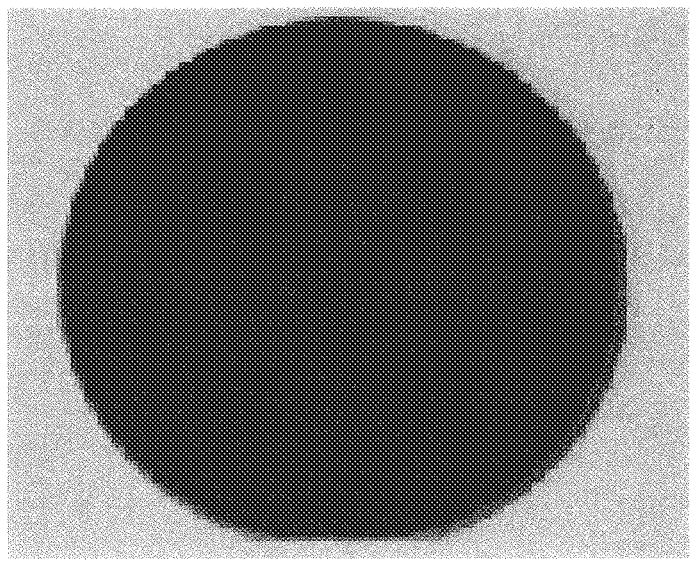
FIGS. 7A and 7B show evaluation results of the adhesiveness of the reflective film.
Figure 7B:
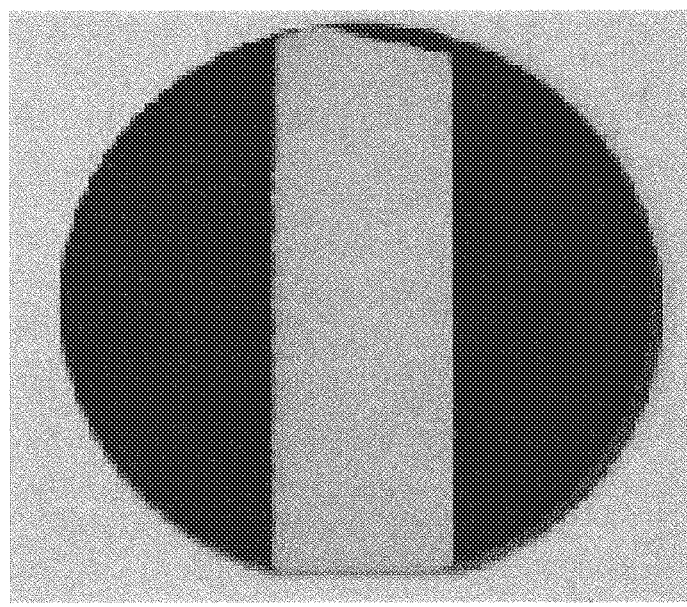

Here, FIGS. 7A and 7B show evaluation results of the adhesiveness between the reflective film 180 and the p-metal reflective layer 302. FIG. 7A is a top view of a sample whose adhesiveness was evaluated by using IZO (indium zinc oxide ($In_2O_3$—ZnO) as the p-adhesion layer 301, and FIG. 7B shows a top view of a sample whose adhesiveness was evaluated without providing the p-adhesion layer 301 as a control experiment.

First, description will be given for the samples used for the experiment. As mentioned above, in the FIGS. 7A and 7B, two different samples were used. However, these samples have a section having a common layer configuration. The layer configuration of the common section is formed as follows. That is, on a sapphire substrate, a layer composed of GaN as the p-type semiconductor layer 160, and a layer composed of IZO as the transparent conductive layer 170 were laminated in this order, and IZO was crystallized by heat treatment. After $SiO_2$ (thickness: 6Q) was formed as the reflective film 180 on the layer composed of IZO, and it was exposed to air. Here, Q denotes a value obtained by dividing the light emission wavelength λ (nm) of the light-emitting layer 150 by four times of the refractive index n of the reflective film 180, as mentioned above.

As for the sample shown in FIG. 7A, IZO (thickness: 2 nm, amorphous) as the p-adhesion layer 301, an Ag (silver) alloy (thickness: 100 nm) as the p-metal reflective layer 302, and Ta (tantalum) (thickness: 50 nm) as the first diffusion barrier layer 303 were formed on $SiO_2$ in this order.

On the other hand, as for the sample shown in FIG. 7B, an Ag (silver) alloy (thickness: 100 nm)/Ta (tantalum) (50 nm) were formed on $SiO_2$.

The evaluation of the adhesiveness of each sample was conducted by observing the condition of each sample after peeling a rectangular adhesive tape attached to a part of the surface of the sample and comparing the peeled section with another section of the sample where the tape was not attached.

Description will be given for the samples whose adhesiveness was evaluated, which are shown as FIGS. 7A and 7B.

First, in the sample shown in FIG. 7A, difference between the section where the tape was peeled after the tape was attached thereto and the section where the tape was not attached was not visually observed. As shown in FIG. 7A, difference in color on the top surface of the sample is not recognized. That is, peeling was not recognized between an Ag (silver) alloy and $SiO_2$.

On the other hand, in the sample shown in FIG. 7B, difference between the section where the tape was peeled after the tape was attached thereto and the section where the tape was not attached was visually observed. As shown in FIG. 7B, a part of the top surface of the sample is a light color. The light-color section is the section where the tape was attached. That is, peeling was recognized between an Ag (silver) alloy and $SiO_2$.

In the case where the p-adhesion layer 301 was not provided, it was confirmed that the adhesiveness was deteriorated.

Accordingly, it was confirmed that, in comparison with the sample shown in FIG. 7B, that is, the sample where IZO (indium zinc oxide) as the p-adhesion layer 301 was not used, the sample shown in FIG. 7A, that is, the sample where IZO (indium zinc oxide) as the p-adhesion layer 301 was laminated was excellent in adhesiveness.

Figure 8A:
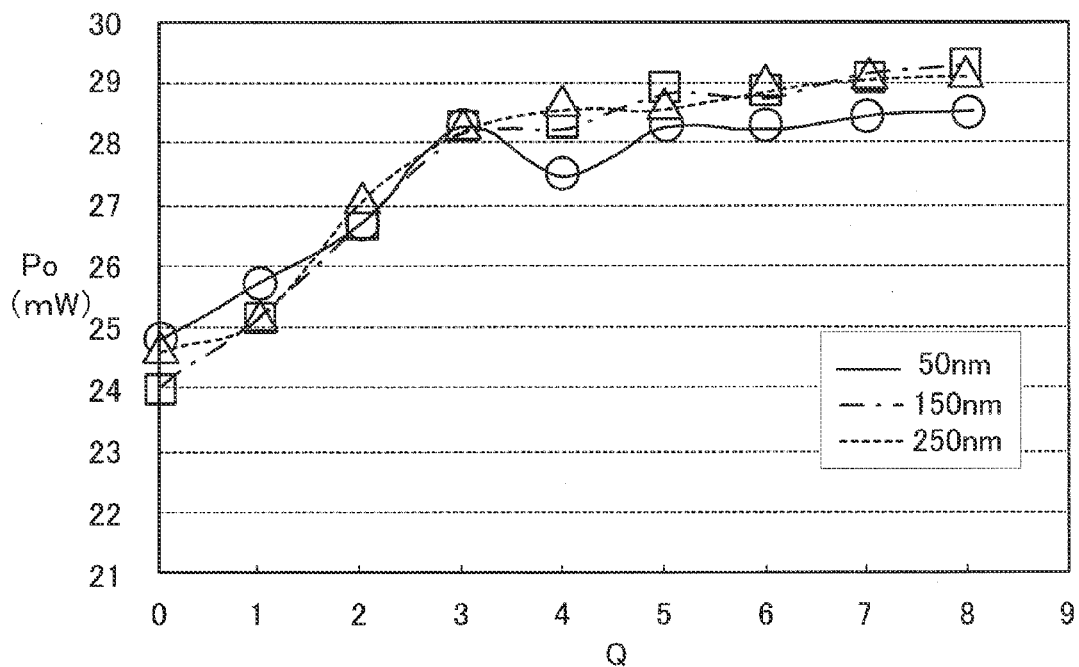
FIGS. 8A and 8B show measurement results of light output when the semiconductor light-emitting element shown in FIG. 1 is used.
Figure 8B:
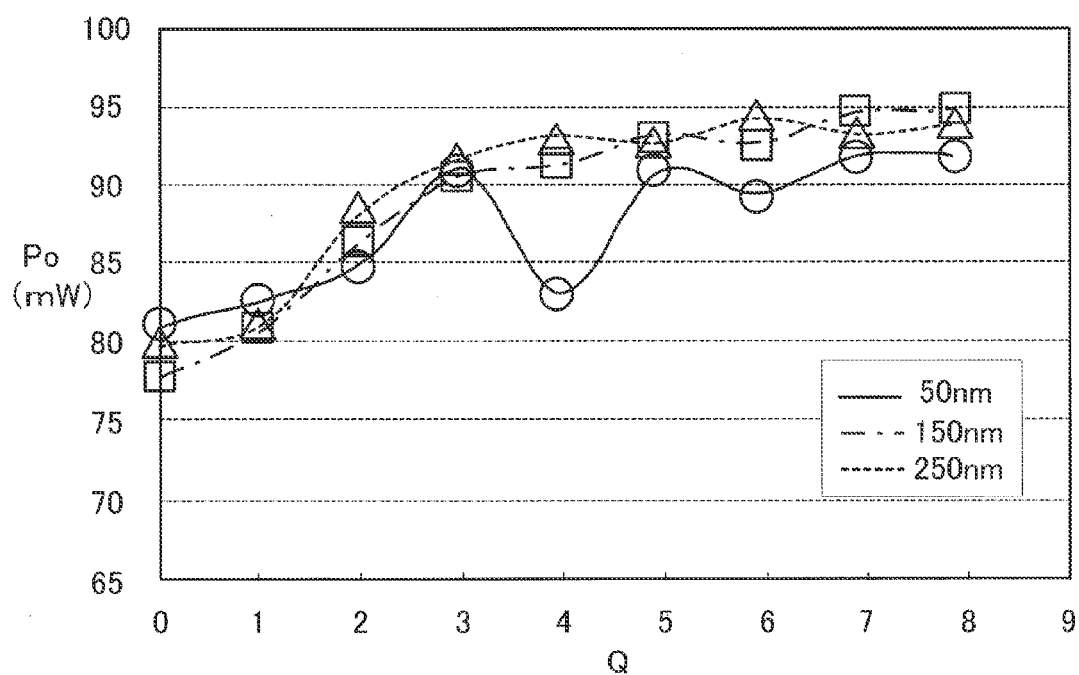

Next, the inventor produced the semiconductor light-emitting element 1 shown in FIG. 1 and FIG. 2, and measured output of the semiconductor light-emitting element 1 while changing the thickness of the reflective film 180. The results are shown in FIGS. 8A and 8B. Note that, the semiconductor light-emitting element 1 shown in FIG. 1 and FIG. 2 was produced by a following method.

On the substrate 110 composed of sapphire, the intermediate layer 120 (buffer layer) composed of AlN (aluminum nitride) was formed by sputtering, and then the base layer 130 composed of undoped GaN (gallium nitride) having the thickness of 5 μm was grown by a MOCVD (metal organic chemical vapor deposition) method. Next, after the n-type semiconductor layer 140 composed of a Si doped n-type GaN contact layer having the thickness of 2 μm and an n-type $In_{0.1}Ga_{0.9}N$ cladding layer having the thickness of 250 nm was formed, the light-emitting layer 150 composed of a Si doped GaN barrier layer having the thickness of 16 nm and a $In_{0.2}Ga_{0.8}N$ well layer having the thickness of 2.5 nm was formed. Further, the p-type semiconductor layer 160 composed of a Mg (magnesium) doped p-type $Al_{0.07}Ga_{0.93}N$ cladding layer having the thickness of 10 nm and a Mg doped p-type GaN contact layer having the thickness of 150 nm was formed in series.

Subsequently, on the p-type semiconductor layer 160, a transparent conductive layer 170 composed of IZO having a predetermined thickness (three levels of 250 nm, 150 nm and 50 nm) was formed by sputtering, heat treatment and the like, and then mask formation and dry etching were conducted to expose the n-type contact layer at a desired region. Next, a reflective film composed of $SiO_2$ (silicon oxide) as the reflective film 180 was formed with a desired thickness (for example, the thickness was the integral multiple of the aforementioned Q, λ=450 nm) by sputtering. Then, plural penetration holes having the diameter of 10 μm were formed at desired positions of the reflective film 180, and were set as the penetration holes for forming the p-connecting conductors 202 and the n-connecting conductors 402.

Further, by using a publicly-known mask forming process, as shown in FIG. 2, the p-adhesion layer 301 composed of IZO having the thickness of 2 nm was laminated at the region where the p-electrode 300 was to be formed, the p-metal reflective layer 302 composed of a silver alloy having the thickness of 150 nm was laminated on the p-adhesion layer 301, and the first diffusion barrier layer 303 composed of Ta having the thickness of 50 nm, the third diffusion barrier layer 305 composed of Ti having the thickness of 300 nm, the fourth diffusion barrier layer 306 composed of Pt having the thickness of 100 nm, and the second bonding layer 307 composed of Au having the thickness of 550 nm were laminated thereon in this order. Note that, in this example, the second diffusion barrier layer 304 exemplified in FIG. 2 was not formed. In addition, the p-adhesion layer 301 composed of IZO was formed by amorphous IZO without annealing treatment.

Further, by using a publicly-known mask forming process, as shown in FIG. 2 as an example, the n-metal reflective layer 311 composed of an Al—Nd alloy having the thickness of 150 nm was laminated at the region where the n-electrode 310 was to be formed, the first diffusion barrier layer 312 composed of Ta having the thickness of 50 nm was laminated on the n-metal reflective layer 311, and the third diffusion barrier layer 314 composed of Ti having the thickness of 300 nm, the fourth diffusion barrier layer 315 composed of Pt having the thickness of 100 nm and the first bonding layer 316 composed of Au having the thickness of 550 nm were laminated thereon in this order.

Next, the protective adhesion layer 308 composed of Ta having the thickness of 15 nm was formed to cover the second bonding layer 307 except for the exposed section of the second bonding layer 307, and the protective adhesion layer 317 composed of Ta having the thickness of 15 nm was formed to cover the first bonding layer 316 except for the exposed section of the first bonding layer 316.

Finally, the passivation layer 320 composed of $SiO_2$ having the thickness of 300 nm was formed to cover the protective adhesion layer 317 except for the exposed section of the first bonding layer 316 and the exposed position of the second bonding layer 307. The characteristics of the n-electrode 310 and the p-electrode 300 were listed in Table 1 and Table 2.

TABLE 1

| P side | | Thickness/nm | Material |
|---|---|---|---|
| p-adhesion layer | 301 | 2 | IZO |
| p-metal reflective layer | 302 | 150 | Ag alloy |
| first diffusion barrier layer | 303 | 50 | Ta |
| second diffusion barrier layer | 304 | Not used | — |
| third diffusion barrier layer | 305 | 300 | Ti |
| fourth diffusion barrier layer | 306 | 100 | Pt |
| second bonding layer | 307 | 550 | Au |
| protective adhesion layer | 308 | 15 | Ta |

TABLE 2

| N side | | Thickness/nm | Material |
|---|---|---|---|
| n-metal refective layer | 311 | 150 | Al alloy |
| first diffusion barrier layer | 312 | 50 | Ta |
| second diffusion barrier layer | 313 | Not used | — |
| third diffusion barrier layer | 314 | 300 | Ti |
| fourth diffusion barrier layer | 315 | 100 | Pt |
| first bonding layer | 316 | 550 | Au |
| protective adhesion layer | 317 | 15 | Ta |

Here, FIG. 8A shows light output when a current of 20 mA is supplied, and FIG. 8B shows light output when a current of 80 mA is supplied. In each of FIGS. 8A and 8B, the vertical axis shows output Po (mW), and the horizontal axis shows the thickness H of the reflective film 180 by using a unit as the aforementioned Q.

In FIGS. 8A and 8B, $SiO_2$ (silicon oxide) is used as the reflective film 180. Further, IZO (indium zinc oxide ($In_2O_3$—ZnO)) is used as the transparent conductive layer 170, and the thickness thereof is 50 nm, 150 nm or 250 nm. The light emission wavelength of the light-emitting layer 150 is 450 nm. In this example, the p-electrode 300 is provided with: the p-adhesion layer 301 composed of IZO (indium zinc oxide ($In_2O_3$—ZnO)) on the reflective film 180; and the p-metal reflective layer 302 composed of an Ag (silver) alloy (thickness: 100 nm) on the p-adhesion layer 301.

Note that, the relationship between the refractive indexes of these layers is the reflective film 180 ($SiO_2$: n=1.48)<the transparent conductive layer 170 (IZO: n=2.1), and the reflective film 180 ($SiO_2$)<the p-adhesion layer 301 (IZO). Further, the relationship is the reflective film 180 ($SiO_2$)>the p-metal reflective layer 302 (an Ag alloy).

As shown in FIGS. 8A and 8B, it is confirmed that the output Po is increased by providing the reflective film 180. It is considered that this is due to the following reason. That is, after limiting the flow of the current by providing the reflective film 180 having the insulating property on the transparent conductive layer 170, a current is flowed only in a part (the p-connecting conductor 202) thereby to contribute the uniform diffusion of the current over the whole surface of the p-electrode 300. As a result, it is also considered that the output Po is increased in the configuration in which the reflective film 180 is provided, in comparison with the configuration in which the p-metal reflective layer 302 and the p-adhesion layer 301 are directly laminated on the transparent conductive layer 170 (the state where the horizontal axis is zero in FIGS. 8A and 8B).

Further, as shown in FIGS. 8A and 8B, it was confirmed that the output of the semiconductor light-emitting element 1 depended on the thickness H of the reflective film 180. Specifically, as the thickness H of the reflective film 180 increases, the output of the semiconductor light-emitting element 1 increases.

Thereby, it is also considered that the phase of light reflected between the p-type semiconductor layer 160 and the transparent conductive layer 170, the phase of the light reflected between the transparent conductive layer 170 and the reflective film 180 and the phase of the light reflected between the p-adhesion layer 301 and the p-metal reflective layer 302 coincide with each other by increasing the thickness of the reflective film 180, the reflection is increased, and as a result, the output of the semiconductor light-emitting element 1 is increased.

Furthermore, from FIGS. 8A and 8B, it is recognized that, as the thickness H of the reflective film 180 increases until the thickness H becomes 3Q, the output Po greatly increases, and the output Po gradually increases if the thickness H is larger than 5Q. From another point of view, if the thickness H is larger than 5Q, it is recognized that the output Po stabilizes in every condition. That is, it was confirmed that, in order to stably obtain the semiconductor light-emitting element 1 in which the output Po had been improved, the thickness of the reflective film 180 was preferably 3Q or more, and more preferably 5Q or more.

Next, the inventor simulated the relationship between the thickness of the reflective film 180 and the reflectance in the case where Ag (silver) was used as the p-metal reflective layer 302 used for the p-electrode 300. The experimental result will be described with reference to FIG. 9.

Figure 9:
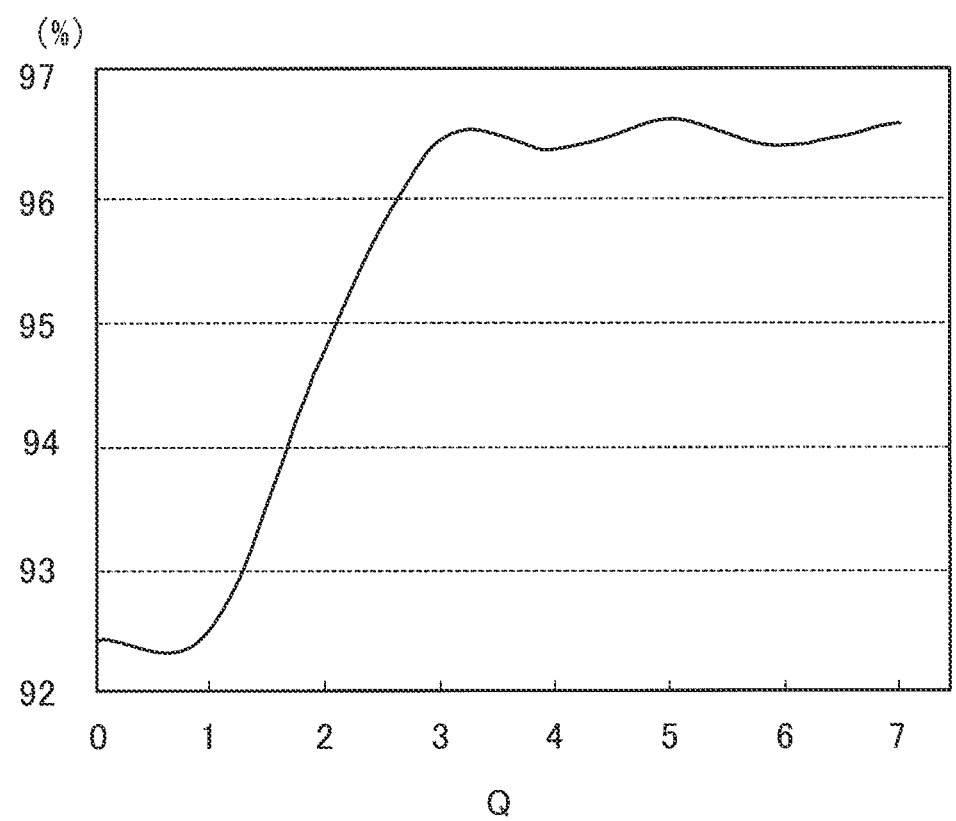
FIG. 9 is a graph showing the simulation result of the reflectance in the case where Ag (silver) is used as the second metal reflective layer for the p-electrode.

Here, FIG. 9 is a graph showing the simulation result of the reflectance in the case where Ag (silver) is used as the p-metal reflective layer 302 of the p-electrode 300.

First, as for the simulation condition, GaN is used as the p-type semiconductor layer 160, and IZO having the thickness of 50 nm is formed as the transparent conductive layer 170 on the p-type semiconductor layer 160. Then, $SiO_2$ (thickness: 0 to 7Q) is formed as the reflective film 180 on the transparent conductive layer 170. Further, Ag having the thickness of 150 nm is formed as the p-metal reflective layer 302 on the reflective film 180. Here, the light wavelength λ emitted from the light-emitting layer 150 is 450 nm, and the refractive indexes of the p-type semiconductor layer 160, the transparent conductive layer 170 and the reflective film 180 at λ=450 nm are 2.44, 2.13 and 1.48, respectively.

As the simulation result, it is confirmed that the reflectance tends to be increased by providing the reflective film 180 as shown in FIG. 9. This shows the same tendency as the result in which the output Po is increased by providing the reflective film 180 in FIGS. 8A and 8B.

Further, as shown in FIG. 9, it is recognized that the reflectance greatly increases from around a point where the thickness of the reflective film 180 is 3Q. Accordingly, in this condition, it is considered that the output Po of the semiconductor light-emitting element 1 is increased by setting the thickness of the reflective film 180 to be 3Q or more.

Furthermore, as shown in FIG. 9, it is considered that the reflectance stabilizes in the range where the thickness of the reflective film 180 is larger than 5Q. Accordingly, it was considered that production was preferably conducted in the state where the thickness is larger than 5Q in order to stably obtain the semiconductor light-emitting element 1 in which the output Po had been improved, and also in this point, it was confirmed that this shows the same tendency as the result shown in FIGS. 8A and 8B.

Still furthermore, as shown in FIG. 9, it is recognized that, in the case where the thickness H of the reflective film 180 is an odd multiple of Q not less than 3 times thereof (H=3Q, 5Q, 7Q . . . ), the light output Po of the semiconductor light-emitting element 1 increases in comparison with the case where the thickness H of the reflective film 180 is an even multiple of Q (H=2Q, 4Q, 6Q . . . ).

Accordingly, it was confirmed that, in order to obtain the semiconductor light-emitting element 1 in which the output Po had been improved, the thickness H of the reflective film 180 was preferably set to be the odd multiple of Q not less than 3 times thereof, and more preferably set to be the odd multiple of Q not less than 5 times thereof.

Here, the range in which the thickness H of the reflective film 180 is an odd multiple of Q not less than 3 times thereof is referred to as the range of the thickness H in which the output Po of the semiconductor light-emitting element 1 increases in FIG. 9, that is, the range of the thickness H in which the graph is convex in the upper direction in FIG. 9. Accordingly, the range in which the thickness H is the odd multiple of Q not less than 3 times thereof shows that the thickness H is within the range of the aforementioned inequalities (3).

Further, from the result of FIG. 9, in terms of more increase of the light output Po of the semiconductor light-emitting element 1, it was confirmed that the thickness H of the reflective film 180 preferably had a relationship as $(\lambda/4n)\times(B-0.4) \leq H \leq (\lambda/4n)\times(B+0.4)$ within the range of the aforementioned inequalities (3), in the case where B is set to be an odd number not less than 3, and more preferably had a relationship as $(\lambda/4n)\times(B-0.3) \leq H \leq (\lambda/4n)\times(B+0.3)$.

Furthermore, from the result of FIG. 9, it was confirmed that B was more preferably an odd number not less than 5.

Next, the inventor simulated a relationship between the thickness of the reflective film 180 and the reflectance in the case Al (aluminum) was used as the n-metal reflective layer 311 used for the n-electrode 310. The experimental result will be described with reference to FIG. 10.

Figure 10:
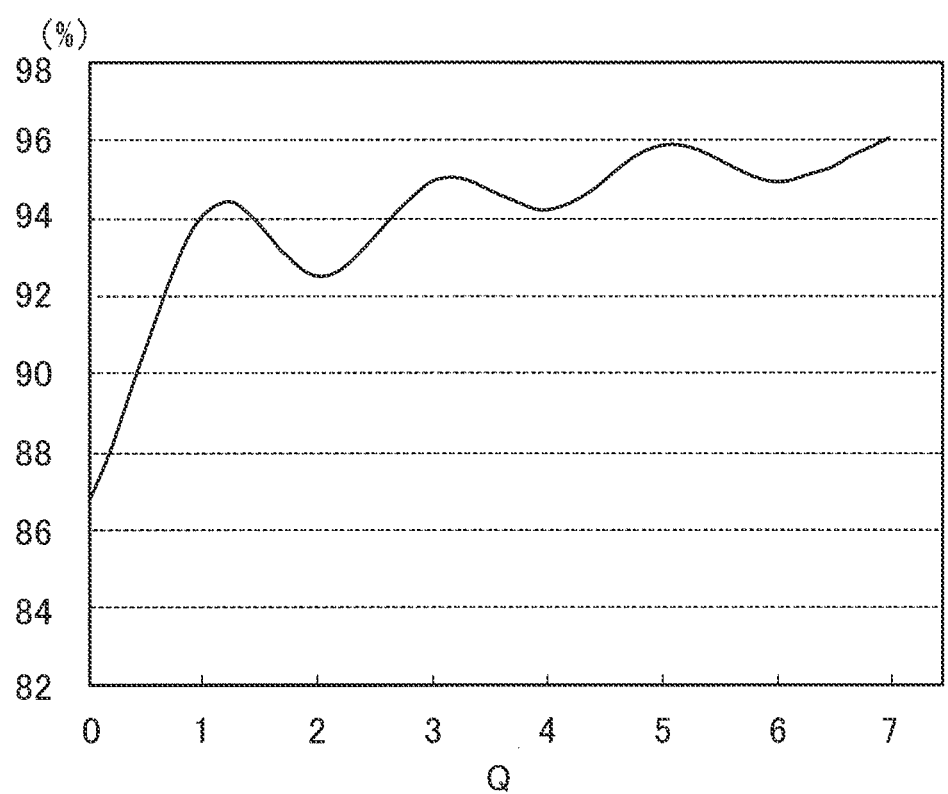
FIG. 10 is a graph showing the simulation result of the reflectance in the case where Al (aluminum) is used as the first diffusion barrier layer for the n-electrode.

Here, FIG. 10 is a graph showing the simulation result of the reflectance in the case where Al (aluminum) is used as the n-metal reflective layer 311 of the n-electrode 310.

First, as for the simulation condition, GaN is used as the n-type semiconductor layer 140, and $SiO_2$ (thickness: 0 to 7Q) is formed as the reflective film 180 on the n-type semiconductor layer 140. Then, Al having the thickness of 150 nm is formed as the n-metal reflective layer 311 on the reflective film 180. Here, the light wavelength λ emitted from the light-emitting layer 150 is 450 nm, and the refractive indexes of the n-type semiconductor layer 140 and the reflective film 180 are 2.44 and 1.48, respectively.

As the simulation result, it is confirmed that the reflectance tends to be increased by providing the reflective film 180 as shown in FIG. 10. This shows the same tendency as FIG. 9, and further shows the same tendency as the result in which the output Po is increased by providing the reflective film 180 in FIGS. 8A and 8B.

Further, as shown in FIG. 10, it is recognized that the reflectance greatly increases around the points where the thickness of the reflective film 180 is 1Q, 3Q, 5Q and 7Q. This also shows the same tendency as the experimental result shown in FIGS. 8A and 8B. Accordingly, in this condition, it is considered that the output Po of the semiconductor light-emitting element 1 is increased by setting the thickness of the reflective film 180 to be 1Q, 3Q, 5Q or 7Q.

Furthermore, as shown in FIG. 10, it is considered that the reflectance stabilizes in the range where the thickness of the reflective film 180 is larger than 5Q. Accordingly, it is considered that production is preferably conducted in the state where the thickness is larger than 5Q in order to stably obtain the semiconductor light-emitting element 1 in which the output Po has been improved.

As mentioned above, it was considered that, in order to obtain the semiconductor light-emitting element 1 in which the output Po had been improved, the thickness H of the reflective film 180 was preferably set to be an odd multiple of Q, more preferably set to be an odd multiple thereof not less than 3 times thereof, and furthermore preferably set to be an odd multiple thereof not less than 5 times thereof, in terms of increasing the reflectance of the reflective film 180.

Note that, the range in which the thickness H is an odd multiple of Q not less than 3 times thereof shows that the thickness H is within the range of the aforementioned inequalities (3) in the case B is set to be an odd number not less than 3. Further, in terms of the production cost, it is desirable that B is an odd number not larger than 19 in the inequalities (3).

Further, from the simulation result of FIG. 10, it was confirmed that the thickness H of the reflective film 180 was preferably set within the range having the relationship as $(\lambda/4n)\times(B-0.4) \leq H \leq (\lambda/4n)\times(B+0.4)$ within the range of the aforementioned inequalities (3), and more preferably set within the range of $(\lambda/4n)\times(B-0.3) \leq H \leq (\lambda/4n)\times(B+0.3)$.

Example 2

Next, the semiconductor light-emitting element 1 was produced by changing the materials composing the transparent conductive layer 170 and the p-adhesion layer 301 from those of the semiconductor light-emitting element 1 produced in example 1.

In the example 2, instead of IZO composing the transparent conductive layer 170 and the p-adhesion layer 301 in the semiconductor light-emitting element 1 produced in example 1, ITO (indium tin oxide ($In_2O_3$—$SnO_2$)) was used. ITO composing the transparent conductive layer 170 was crystallized by the annealing treatment similarly to IZO composing the transparent conductive layer 170 in example 1. Further, 50 nm was selected as the thickness of the transparent conductive layer 170 from the predetermined three levels (250 nm, 150 nm and 50 nm) used in example 1.

Further, in example 2, for forming the n-electrode 310, after a Ti layer having the thickness of 2 nm was formed on the n-type semiconductor layer 140, an Al—Nd alloy was laminated as the n-metal reflective layer 311 on the Ti layer.

Note that, the configuration of the semiconductor light-emitting element 1 in example 2 is the same as that of the semiconductor light-emitting element 1 in example 1 except for the configuration of the transparent conductive layer 170, the p-adhesion layer 301 and the aforementioned n-electrode 310.

In example 2, ITO composing the transparent conductive layer 170 and the p-adhesion layer 301 was prepared by using a publicly-known method (for example, sputtering described in Japanese Patent Application Laid Open Publication No. 2009-260237 or the like). Note that, the refractive index n of ITO is n=2.1 to 2.2, and this is the same level of that of IZO used as the transparent conductive layer 170 and the p-adhesion layer 301 in example 1.

Subsequently, the semiconductor light-emitting element 1 produced in example 2 will be evaluated.

The relationship between the output Po in the semiconductor light-emitting element 1 produced in example 2 and the thickness of the reflective film 180 showed the similar behavior to the relationship between the output Po in the semiconductor light-emitting element 1 produced in example 1 shown in FIGS. 8A and 8B and the thickness of the reflective film 180, although the graph thereof was omitted.

In other words, as the thickness H of the reflective film 180 increases, the output Po greatly increases until the thickness H becomes 3Q, and the output Po gradually increases if the thickness H is larger than 5Q. From another point of view, if the thickness H is larger than 5Q, the output Po stabilizes in every condition. That is, it was confirmed that, in order to stably obtain the semiconductor light-emitting element 1 in which the output Po had been improved, production was preferably conducted in the state where the thickness was larger than 5Q.

Note that, ITO used as the transparent conductive layer 170 and the p-adhesion layer 301 in example 2 had the same conductivity as IZO used as the transparent conductive layer 170 and the p-adhesion layer 301 in example 1, and the output Po of the semiconductor light-emitting element 1 in example 2 had the same level as the output Po of the semiconductor light-emitting element 1 in example 1.

Example 3

Further, the semiconductor light-emitting element 1 was produced by changing the materials composing the transparent conductive layer 170 and the p-adhesion layer 301 from those of the semiconductor light-emitting elements 1 produced in example 1 and example 2.

In example 3, instead of IZO composing the transparent conductive layer 170 and the p-adhesion layer 301 in the semiconductor light-emitting element 1 produced in example 1, IGO (indium gallium oxide ($In_2O_3$—$Ga_2O_3$)) was used. IGO composing the transparent conductive layer 170 was crystallized by the annealing treatment similarly to IZO composing the transparent conductive layer 170 in example 1. Further, 50 nm was selected as the thickness of the transparent conductive layer 170 from the predetermined three levels (250 nm, 150 nm and 50 nm) used in example 1.

Note that, the configuration of the semiconductor light-emitting element 1 in example 3 is the same as that of the semiconductor light-emitting element 1 in example 1 except for the configuration of the transparent conductive layer 170 and the p-adhesion layer 301.

In example 3, IGO composing the transparent conductive layer 170 and the p-adhesion layer 301 was prepared by using a publicly-known method (for example, sputtering described in Japanese Patent Application Laid Open Publication No. 2009-260237 or the like). Note that, the refractive index n of IGO is n=2.0.

Subsequently, the semiconductor light-emitting element 1 produced in example 3 will be evaluated.

The relationship between the output Po in the semiconductor light-emitting element 1 produced in example 3 and the thickness of the reflective film 180 showed the similar behavior to the relationship between the output Po in the semiconductor light-emitting element 1 produced in example 1 shown in FIGS. 8A and 8B and the thickness of the reflective film 180, although the graph thereof was omitted.

In other words, as the thickness H of the reflective film 180 increases, the output Po greatly increases until the thickness H becomes 3Q, and the output Po gradually increases if the thickness H is larger than 5Q. From another point of view, if the thickness H is larger than 5Q, the output Po stabilizes in every condition. That is, it was confirmed that, in order to stably obtain the semiconductor light-emitting element 1 in which the output Po had been improved, production was preferably conducted in the state where the thickness was larger than 5Q.

Note that, IGO used as the transparent conductive layer 170 and the p-adhesion layer 301 in example 3 has the conductivity lower than those of IZO used as the transparent conductive layer 170 and the p-adhesion layer 301 in example 1 and ITO used as the transparent conductive layer 170 and the p-adhesion layer 301 in example 2. Further, the surface resistance of the thin-film composed of IGO is higher than those of IZO and ITO.

Accordingly, the output Po of the semiconductor light-emitting element 1 in example 3 is lower than the outputs Po of the semiconductor light-emitting elements 1 in example 1 and example 2 by around 5%.

Comparative Example 1

Next, the semiconductor light-emitting element 1 was produced by changing the material composing the p-adhesion layer 301 from that of the semiconductor light-emitting element 1 produced in example 1.

In comparative example 1, instead of IZO composing the p-adhesion layer 301 in the semiconductor light-emitting element 1 produced in example 1, IGO was used. IGO composing the p-adhesion layer 301 was prepared by using a publicly-known method (for example, sputtering described in Japanese Patent Application Laid Open Publication No. 2009-260237 or the like).

Note that, the configuration of the semiconductor light-emitting element 1 in comparative example 1 is the same as that of the semiconductor light-emitting element 1 in example 1 except for the configuration of the transparent conductive layer 170, the p-adhesion layer 301 and the aforementioned n-electrode 310. Accordingly, in comparative example 1, the transparent conductive layer 170 was formed by IZO similarly to the example 1. Further, 50 nm was selected as the thickness of the transparent conductive layer 170 from the predetermined three levels (250 nm, 150 nm and 50 nm) used in example 1.

Subsequently, the semiconductor light-emitting element 1 produced in comparative example 1 will be evaluated.

The relationship between the output Po in the semiconductor light-emitting element 1 produced in comparative example 1 and the thickness of the reflective film 180 showed the similar behavior to the relationship between the output Po in the semiconductor light-emitting element 1 in example 1 shown in FIGS. 8A and 8B and the thickness of the reflective film 180, although the graph thereof was omitted. However, the output Po of the semiconductor light-emitting element 1 in comparative example 1 was lower than the outputs Po of the semiconductor light-emitting elements 1 in example 1 and example 2 by around 5%.

Further, the forward voltage Vf of the semiconductor light-emitting element 1 increased in comparison with the forward voltage Vf of the semiconductor light-emitting element 1 in example 1.

It is considered that, in the comparative example 1, the output Po of the semiconductor light-emitting element 1 is decreased in comparison with example 1 and example 2, and the forward voltage Vf increases since the transparent conductive layer 170 and the p-adhesion layer 301 are composed of different materials and reduction in conductive property between the transparent conductive layer 170 and the p-adhesion layer 301 is observed.

Further, from another sputtering film forming experiment, it was confirmed that crystallinity at the interface between IZO and IGO decreased in the case where IGO was formed on IZO. Thereby, in the case where IZO was used as the transparent conductive layer 170 and IGO was used as the p-adhesion layer 301, which was different from IZO, it was confirmed that the adhesiveness between the transparent conductive layer 170 and the p-adhesion layer 301 in the p-conductive body 200 decreased.

Further, similarly to example 1, a tape test was conducted for a sample in which $SiO_2$ was formed as the reflective film 180 on the transparent conductive layer 170 composed of IZO, IGO as the p-adhesion layer 301, an Ag (silver) alloy as the p-metal reflective layer 302 and Ta (tantalum) as the first diffusion barrier layer 303 are laminated on the $SiO_2$ in this order, and consequently it was confirmed that the adhesiveness between the transparent conductive layer 170 and the reflective film 180 decreased in comparison with example 1.

REFERENCE SIGNS LIST

1 . . . Semiconductor light-emitting element
100 . . . Laminated semiconductor layer
110 . . . Substrate
120 . . . Intermediate layer
130 . . . Base layer
140 . . . N-type semiconductor layer
140c . . . Top surface
150 . . . Light-emitting layer
160 . . . P-type semiconductor layer
170 . . . Transparent conductive layer
170c . . . Top surface
180 . . . Reflective film
180c . . . Top surface on p-electrode side
180d . . . Top surface on n-electrode side
200 . . . P-conductive body
202 . . . P-connecting conductor
300 . . . P-electrode
310 . . . N-electrode
400 . . . N-conductive body
402 . . . N-connecting conductor

The invention claimed is:

1. A semiconductor light-emitting element comprising:
a first semiconductor layer that is composed of a group-III nitride semiconductor having a first conductivity type;
a light-emitting layer that is laminated on one surface of the first semiconductor layer to expose a part of the one surface, and that emits light upon conducting an electric power;
a second semiconductor layer that is composed of a group-III nitride semiconductor having a second conductivity type different from the first conductivity type, and that is laminated on the light-emitting layer;
a first transparent conductive layer that is composed of a material having transparency to light emitted from the light-emitting layer and a conductive property, and that is laminated on the second semiconductor layer;
a transparent insulating layer that is composed of a material having transparency to the light emitted from the light-emitting layer and an insulating property, that has a penetration hole in a thickness direction, and that is laminated on the first transparent conductive layer;
a first electrode that is electrically connected to the first semiconductor layer; and
a second electrode that is configured with a second transparent conductive layer and a metal reflective layer, the second transparent conductive layer being composed of a material same as the material of the first transparent conductive layer and laminated to cover the transparent insulating layer and the first transparent conductive layer exposed through the penetration hole, the metal reflective layer being composed of a metal material having reflectance to the light emitted from the light-emitting layer and a conductive property and laminated on the second transparent conductive layer, wherein
at least a part of the second transparent conductive layer contacts the first transparent conductive layer.

2. The semiconductor light-emitting element according to claim 1, wherein a thickness of the second transparent conductive layer laminated on the first transparent conductive layer exposed through the penetration hole is thinner than a thickness of the transparent insulating layer.

3. The semiconductor light-emitting element according to claim 2, wherein the first transparent conductive layer and the second transparent conductive layer are composed of a metal oxide.

4. The semiconductor light-emitting element according to claim 3, wherein the metal oxide is a metal oxide containing indium.

5. The semiconductor light-emitting element according to claim 4, wherein the metal oxide containing indium is IZO (indium zinc oxide).

6. The semiconductor light-emitting element according to claim 5, wherein
the first transparent conductive layer is composed of crystallized IZO,
the second transparent conductive layer is composed of uncrystallized IZO, and
the thickness of the second transparent conductive layer laminated on the first transparent conductive layer exposed through the penetration hole is thinner than a thickness of the first transparent conductive layer.

7. The semiconductor light-emitting element according to claim 6, wherein a sum of the thickness of the second transparent conductive layer laminated on the first transparent conductive layer exposed through the penetration hole and a thickness of the metal reflective layer laminated on the second transparent conductive layer laminated on the first transparent conductive layer is smaller than the thickness of the transparent insulating layer.

8. The semiconductor light-emitting element according to claim 2, wherein a sum of the thickness of the second transparent conductive layer laminated on the first transparent conductive layer exposed through the penetration hole and a thickness of the metal reflective layer laminated on the second transparent conductive layer laminated on the first transparent conductive layer is smaller than the thickness of the transparent insulating layer.

9. The semiconductor light-emitting element according to claim 8, wherein the first transparent conductive layer and the second transparent conductive layer are composed of a metal oxide.

10. The semiconductor light-emitting element according to claim 9, wherein the metal oxide is a metal oxide containing indium.

11. The semiconductor light-emitting element according to claim 10, wherein the metal oxide containing indium is IZO.

12. The semiconductor light-emitting element according to claim 1, wherein the first transparent conductive layer and the second transparent conductive layer are composed of a metal oxide.

13. The semiconductor light-emitting element according to claim 12, wherein the metal oxide is a metal oxide containing indium.

14. The semiconductor light-emitting element according to claim 13, wherein the metal oxide containing indium is IZO.

15. The semiconductor light-emitting element according to claim 14, wherein
the first transparent conductive layer is composed of crystallized IZO,
the second transparent conductive layer is composed of uncrystallized IZO, and
a thickness of the second transparent conductive layer laminated on the first transparent conductive layer exposed through the penetration hole is thinner than a thickness of the first transparent conductive layer.

16. The semiconductor light-emitting element according to claim 1, wherein the transparent insulating layer is composed of a material having a refractive index lower than those of the first transparent conductive layer and the second transparent conductive layer.

17. The semiconductor light-emitting element according to claim 1, wherein
the first transparent conductive layer is composed of a material having a first refractive index,
the transparent insulating layer is composed of a material having a second refractive index lower than the first refractive index, and
a thickness H of the transparent insulating layer has a relation as $(\lambda/4n) \times (B-0.5) \leq H \leq (\lambda/4n) \times (B+0.5)$, where the second refractive index is denoted by n, a wavelength of the light emitted from the light-emitting layer is denoted by $\lambda$ and B is set as an odd number not less than 3.

18. The semiconductor light-emitting element according to claim 1, wherein the metal reflective layer is composed of silver or a silver alloy.

19. The semiconductor light-emitting element according to claim 1, wherein the transparent insulating layer is composed of silicon dioxide.

20. The semiconductor light-emitting element according to claim 1, wherein the transparent insulating layer is laminated on (i) the first transparent conductive layer, (ii) those portions of the second semiconductor layer on which the first transparent conductive layer is not laminated, and (iii) those portions of the first semiconductor layer on which the light-emitting layer is not laminated, and further, wherein the transparent insulating layer is laminated on side surfaces of the light-emitting layer, the second semiconductor layer and the first transparent conductive layer.

* * * * *